United States Patent [19]

Valentian

[11] Patent Number: 5,372,500
[45] Date of Patent: Dec. 13, 1994

[54] LOADER DEVICE FOR AN AUTOMATIC FURNACE IN SPACE

[75] Inventor: Dominique Valentian, Rosny, France

[73] Assignee: Societe Europeenne de Propulsion, Suresnes, France

[21] Appl. No.: 154,937

[22] Filed: Nov. 19, 1993

[30] Foreign Application Priority Data

Dec. 1, 1992 [FR] France ............... 92 14469

[51] Int. Cl.$^5$ ............... F27D 5/00; B23K 9/00
[52] U.S. Cl. ............... 432/241; 432/225; 414/168; 414/180
[58] Field of Search ............ 432/50, 87, 239, 241, 432/242, 246, 224, 225, 121; 414/147, 149, 160, 172, 173, 182, 183, 184, 192, 168, 180, 207, 208

[56] References Cited

U.S. PATENT DOCUMENTS

| | | | |
|---|---|---|---|
| 4,725,227 | 2/1988 | Hailey | 432/239 |
| 4,752,219 | 6/1988 | Fisher | 432/253 |
| 4,770,590 | 9/1988 | Hugues et al. | 414/172 |
| 4,938,691 | 7/1990 | Ohkase et al. | 432/239 |
| 5,009,590 | 4/1991 | Mitarai et al. | 432/121 |

OTHER PUBLICATIONS

"The Material–Science Element of the First Spacelab Payload" (FSLP), ESA Bulletin, No. 31, Aug. 1982, pp. 34–45, U. Huth.
"Multiple Experiment Processing Furnace (MEPF): A Overview" R. Srinivas, et al., IAF-87-406, Teledyne Brown Engineering, Huntsville Ala., USA, Oct. 10 17, 1987, pp. 1–5.

Primary Examiner—John M. Sollecto
Assistant Examiner—William C. Doerrler
Attorney, Agent, or Firm—Weingarten, Schurgin, Gagnebin & Hayes

[57] ABSTRACT

A loader device for an automatic space treatment furnace having a longitudinal axis and means for driving the furnace in guided translation along said longitudinal axis. The loader device is disposed in the vicinity of the furnace and comprises both a cartridge-carrying carousel fitted with a set of cartridge holders removably receiving sealed closed cartridges each designed to contain a sample for treatment in said space furnace, the cartridges being disposed in the carousel parallel to its axis of rotation, and a control mechanism for imparting indexed rotary drive to the cartridge holders. The carousel is itself mounted relative to the furnace in such a manner that its axis of rotation forms a predetermined angle a relative to the longitudinal axis of the furnace, and each cartridge holder of the carousel co-operates with a tilting mechanism to enable each cartridge to take up a working position in which the axis of the cartridge is tilted through said predetermined angle α relative to the axis of rotation of the carousel so as to be aligned with the axis of the furnace.

22 Claims, 17 Drawing Sheets

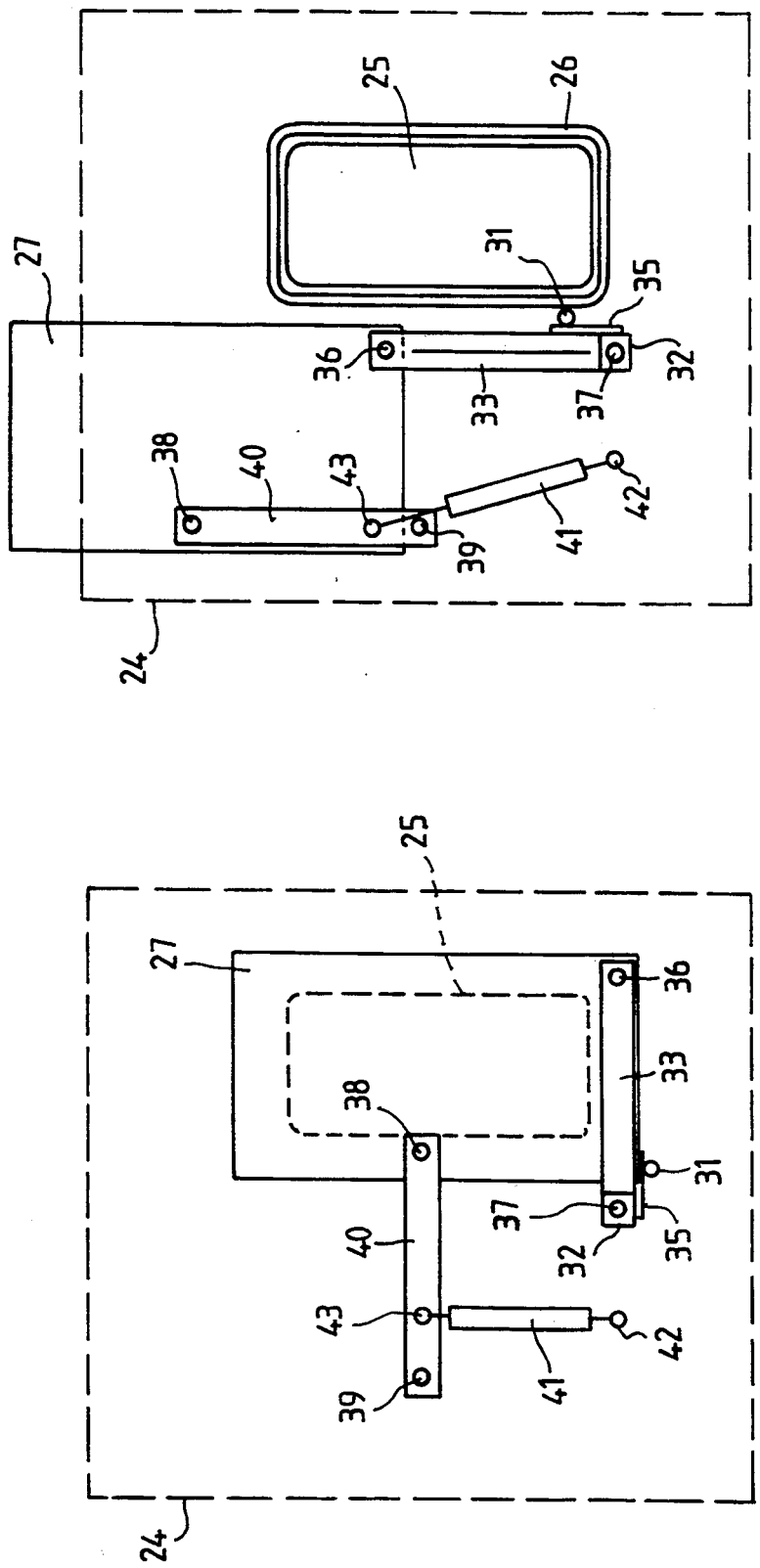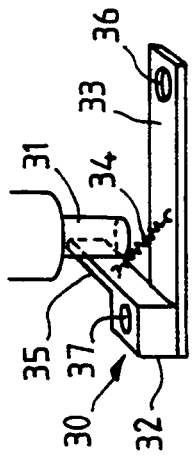
FIG. 10B
FIG. 10C
FIG. 10A

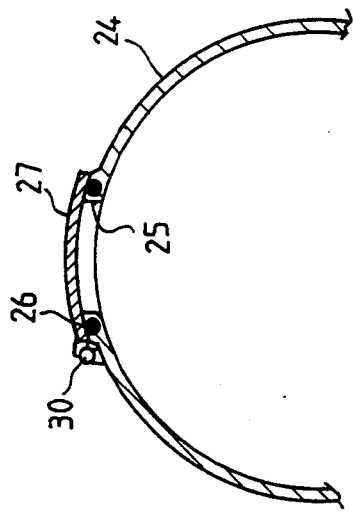
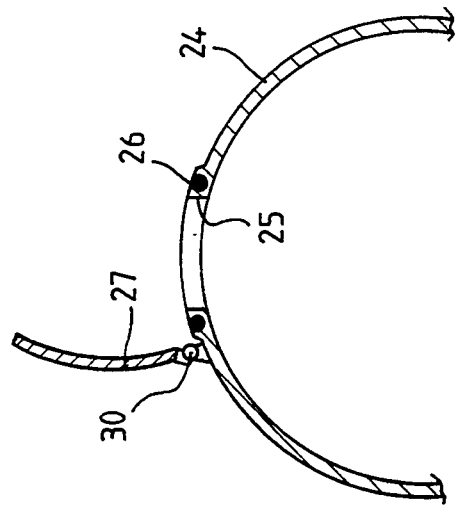
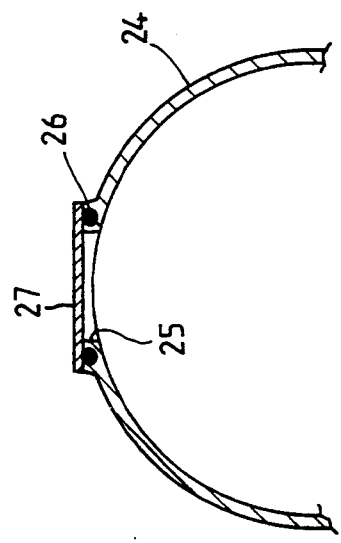
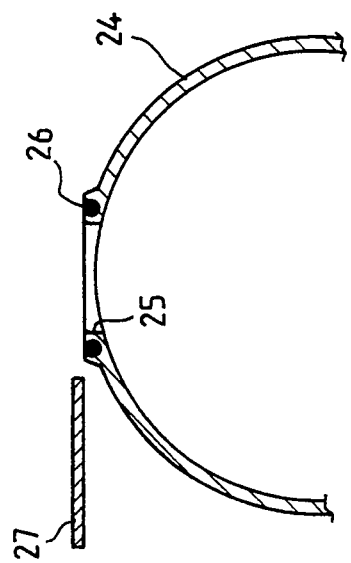

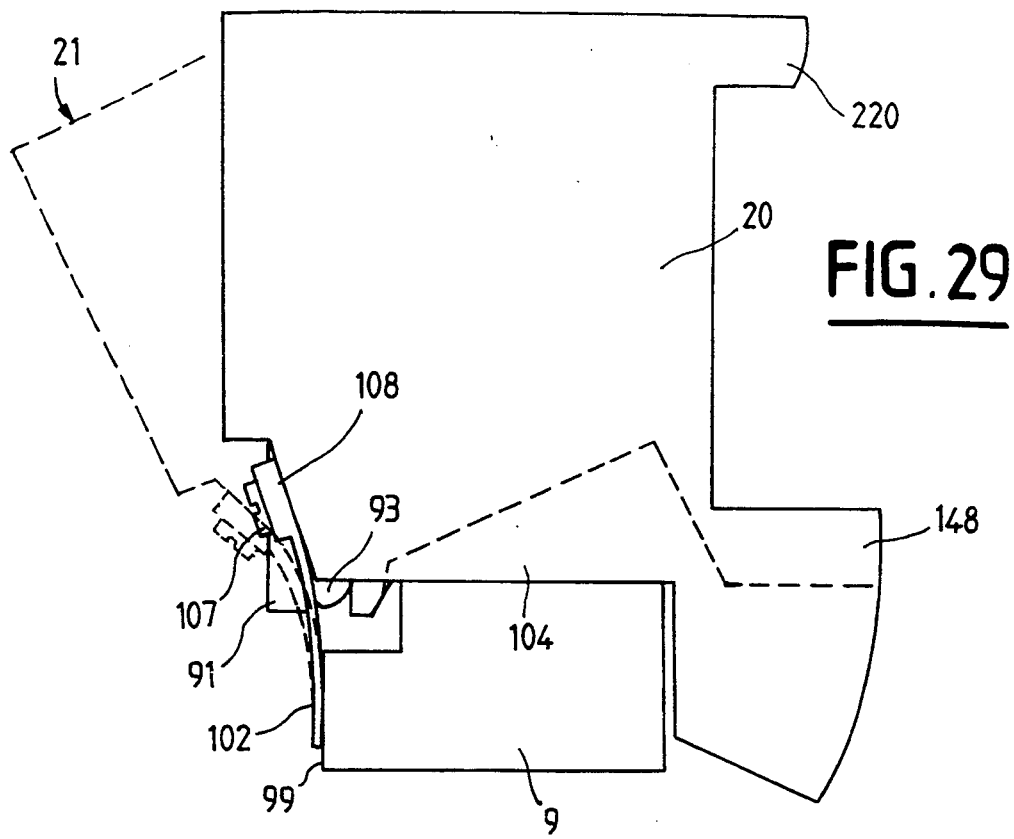
FIG. 29
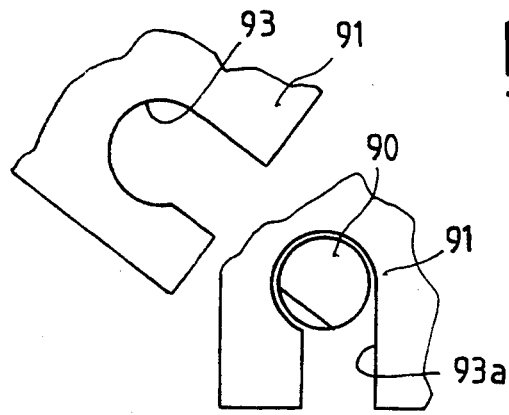
FIG. 30A
FIG. 30B
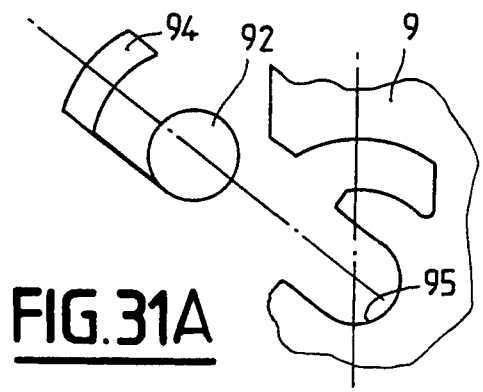
FIG. 31A
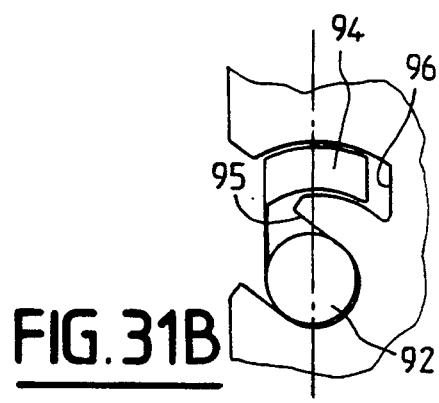
FIG. 31B

LOADER DEVICE FOR AN AUTOMATIC FURNACE IN SPACE

FIELD OF THE INVENTION

In general terms, the present invention relates to control mechanisms for furnaces installed on space stations or on satellites and that need to operate automatically over periods of time that are long, of the order of several months, until visited by an astronaut or until the satellite is recovered.

Automatic space furnaces enable various treatments to be performed in microgravity on samples that are placed in cartridges which are closed in sealed manner.

Examples of treatments that can be performed in space furnaces include oriented solidification, in particular of semiconductors such as gallium arsenide, indium phosphide and indium antimonide, or else solidification from the vapor phase, in particular by epitaxy, e.g. for mercury-doped cadmium telluride.

The present invention relates more particularly to a device for loading and unloading the furnace enabling sealed closed cartridges that have previously been prepared on the ground and stored in a magazine disposed in a space station or a satellite close to a treatment furnace to be inserted automatically into the furnace and then to be withdrawn therefrom, individually, during a space mission and without human intervention.

PRIOR ART

Automatic devices for exchanging samples in space furnaces are already known, in particular from the communication by R. Srinivas and D. Schaefer entitled "IAF-87-406 Multiple Experiment Processing Furnace (MEPF): An Overview" given at the 38th Congress of the International Astronautical Federation (IAF) held in Brighton, UK. from 10 to 17 Oct. 1987.

In such prior implementations (see FIGS. 6 and 7), the samples are placed in closed cartridges 310 themselves disposed in supports or cartridge holders 320 mounted in a carousel in a cylindrical storage magazine 309 which is placed in line with an assembly 302 constituting an enclosure in which the treatment furnace is contained. The storage magazine 309 has an axis of rotation parallel to the longitudinal axis of the furnace, but offset therefrom so that by rotating the carousel, the cartridges 310 are brought successively into a position 311 which is in alignment with the longitudinal axis of the furnace. The holder 321 for the cartridge 311 that is to be inserted into the furnace is then taken hold of by a mechanism 316 that moves the cartridge in translation into the furnace. The furnace 301 is itself fitted with a drive mechanism (not shown in the drawings) for moving it in translation along guide rods so as to enable the sample placed in the working cartridge 311 to be subjected to different temperature zones, as is required for performing solidification, for example.

Prior art automatic space furnaces such as those described in the above-mentioned article thus make use of three different mechanisms for loading and unloading cartridges and for treating the samples in cartridges in the working position, namely: a mechanism for rotating the carousel disposed in the magazine 309 for storing the cartridges 310; a mechanism 316 for displacing the cartridge 311 that is to be loaded or unloaded; and a translation drive mechanism for the treatment furnace 301. Loader devices for known automatic space furnaces are thus relatively complex and difficult to implement, in particular since the cartridge 311 containing a sample to be treated also has a connector provided with electrical contacts for various measurement signals, so it is necessary to enable a proper connection to be made between said connector and a complementary connector associated with the furnace while the cartridge is in the working position. Implementing automatically pluggable connectors in devices that are subjected to large-amplitude translation movement presents problems of alignment and of insertion force.

Prior art furnace loader devices of the type in which cartridges are moved in translation from a magazine superposed on the furnace are also very bulky in spite of the fact that volume available in space stations or satellites is always highly restricted.

Thus, with reference to FIG. 7, it can be seen that the conventional disposition of a process chamber 302 containing a furnace and of the automatic furnace loader assembly 309 in a housing 314 formed in the wall 313 of a space vehicle requires the housing 314 to have a minimum total height h such that:

$$h > 2L + s + P$$

where:
 L = the length of the cartridge 311;
 s = the stroke of the furnace, e.g. for a solidification process, between positions 301' and 301''; and
 P = additional space to enable the carousel 309 to be handled (of the order of about 10 cm).

In practice, the height h, which naturally depends on the type of furnace, is generally at least about 1 meter (m), and the opening 315 enabling the magazine 309 to be exchanged must be not less than L + P, which in practice is about 50 cm to 60 cm.

OBJECT AND BRIEF SUMMARY OF THE INVENTION

The invention seeks to remedy the above-specified drawbacks of prior art devices and in particular to simplify the mechanical devices for automatically positioning and exchanging cartridges between a storage magazine and a working furnace.

More particularly, the invention seeks to provide a loading and unloading device for a space furnace that is compact, lightweight, simple, reliable, and does not give rise to angular or linear momentum that could affect the stability of the satellite or the station that incorporates the device.

The invention also seeks to make it possible to provide more reliable electrical connections between a cartridge in the working position and the support structure of the treatment furnace.

These objects are achieved by a loader device for an automatic space treatment furnace having a longitudinal axis and means for driving the furnace in guided translation along said longitudinal axis, the loader device being disposed in the vicinity of the furnace and comprising both a cartridge-carrying carousel fitted with a set of cartridge holders removably receiving sealed closed cartridges each designed to contain a sample for treatment in said space furnace, the cartridges being disposed in the carousel parallel to its axis of rotation, and a control mechanism for imparting indexed rotary drive to the cartridge holders, wherein the carousel is itself mounted relative to the furnace in such a manner that its axis of rotation forms a predetermined angle α relative to the longitudinal axis of the furnace, and wherein each cartridge holder of the carousel co-operates with a tilting mechanism to enable each cartridge to take up a working position in which the axis of the cartridge is tilted through said predetermined angle α relative to the axis of rotation of the cylinder so as to be aligned with the axis of the furnace.

The control mechanism for imparting indexed rotary drive to the cartridge holders and the mechanism for tilting the cartridge holders are constituted by a single mechanism.

Advantageously, said predetermined angle α between the axis of rotation of the carousel and the longitudinal axis of the furnace lies in the range about 30° to about 50°.

Compared with existing systems, the invention makes it possible to reduce the bulk of the assembly comprising the space furnace and the loader device, and it also makes it possible to reduce the mass of the assembly by omitting one of its mechanisms. When a cartridge that is to be engaged in the furnace has been tilted relative to the axis of rotation of the carousel, the cartridge can be engaged in the furnace merely by moving the furnace in translation.

The greater simplicity of the system increases overall reliability and this is very important in space equipment, since non-operation of a furnace would represent a major loss and would require special intervention by an astronaut, which is itself very expensive.

It may be observed that the loader system of the invention satisfies the constraints of microgravity, with the control system producing no shock on locking even though the system is purely mechanical, whereas when it is the cartridge that is moved in translation, as in prior art devices, there is always the risk of a shock at the end of the stroke.

In the common event of samples that contain substances that are highly toxic, the carousel together with the control mechanism for imparting rotary drive and tilting motion to the cartridge holders are placed inside a hermetic container provided with a closable side opening so as to provide security against possible leaks from the cartridges during transport until they are put into orbit. The door closing the opening is opened selectively to enable a cartridge to take up a sloping position during treatment operations in space.

The furnace and the carousel may be installed in various different configurations, all of which are more compact than systems in which the cartridges are transferred into the furnace by moving in translation.

Thus, in a first possible configuration, the axis of rotation of the carousel is inclined at said predetermined angle α relative to the wall of a space vehicle which is itself parallel to the axis of the furnace which is removably mounted in a housing in said wall.

In another possible configuration, the axis of rotation of the carousel is parallel to the wall of a space vehicle, while the axis of the furnace that is removably mounted in a housing in said wall is itself inclined relative to said wall.

Similarly, cartridges can be mounted in and removed from the storage carousel in various different ways.

In one particular embodiment, the carousel is disposed in a loading compartment provided with a cover disposed at its end opposite from the cartridge holders so as to enable all of the cartridges to be loaded and unloaded through the end opposite from the cartridge holders between two treatment sequences for a set of cartridges.

In another particular embodiment, the carousel is disposed in a loading compartment provided with a cover disposed at the same end as the cartridge holders so as to enable all of the cartridges to be loaded and unloaded through the cartridge holders between two treatment sequences of a set of cartridges.

In yet another particular embodiment, the carousel is disposed in a loading compartment connected by flanges to an enclosure defining a process chamber and containing the furnace together with the control mechanisms for rotating and tilting the cartridge holders so as to enable the carousel assembly to be exchanged between two treatment sequences of a set of cartridges.

The fact that a cartridge can be tilted through a predetermined angle relative to the axis of rotation of the carousel makes it possible to implement electrical connection means that are simpler and more reliable between a cartridge in the working position and the support of the treatment furnace.

Thus, according to a particular feature of the present invention, each cartridge holder comprises an essentially plane interface for mechanical positioning and for electrical connection and adapted to co-operate with a single, essentially plane complementary interface for mechanical positioning and for electrical connection disposed on means for supporting said means for driving the furnace in translation.

By way of example, said mechanical positioning and electrical connection interfaces include complementary V-shaped centering elements.

More particularly, said mechanical positioning and electrical connection interfaces include first electrical contacts for passing high current required for the process during the treatment of samples, and second electrical contacts for passing low current for electrical measurement signals.

In certain applications, the invention makes it easy to implement a device for preheating the cartridges, which device extends statically around at least a fraction of the carousel on either side of an opening that enables a cartridge to be tilted into the working position.

By enabling the cartridges to be stored compactly, the system of the invention ensures good resistance to vibration during launch into space.

In order to improve resistance to vibration, in a particular embodiment, it includes a shock absorber device for damping vibration and comprising both a central wheel disposed in the center of the carousel in the vicinity of the ends of the cartridges opposite from the cartridge holders and provided with depressions formed in its periphery for receiving the ends of the cartridges, and a static outer band which surrounds the central wheel outside the cartridges and which has a gap to enable a cartridge to be tilted into the working position.

The mechanism for imparting indexed rotary drive to the cartridge holders and the mechanism for tilting a cartridge holder may be implemented in various ways.

In a particular embodiment, the control mechanism for imparting indexed rotary drive to the cartridge holders comprises an electric motor which co-operates with a stepdown gear mechanism and a Maltese cross device acting on the bottom portions of the cartridge holders.

More particularly, in a possible embodiment, the control device for imparting indexed rotary drive to the cartridge holders comprises an electric motor that drives a rotation control finger acting on grooves formed in the cartridge holders, and a cam co-operating with recesses formed in the cartridge holders to provide locking in each indexed position.

The electric motor may either have an axis that is parallel to The axis of rotation of the carousel, or else it may have an axis that is perpendicular and that intersects the axis of rotation of the carousel.

The cartridge holder tilting mechanism comprises a short drive system driven by the control mechanism for rotating the cartridge holders.

More particularly, in a first possible embodiment, the cartridge holder tilting mechanism comprises a cam-forming member which is driven from an electric motor constituting the initiator member of the control mechanism for rotating the cartridge holders, and which co-operates with shaped upper portions of the cartridge holders, each cartridge holder also co-operating with a return spring in a rest position parallel to the axis of rotation of the carousel.

In another possible embodiment, the cartridge holder tilting mechanism comprises a slider member which co-operates with shaped upper portions of the cartridge holders and which is driven with reciprocating motion by an electric motor constituting the initiator member of the control mechanism for rotating the cartridge holders.

In yet another embodiment, the cartridge holder tilting mechanism includes a toggle mechanism acting on the upper portions of the cartridge holders and co-operating with an electric motor.

BRIEF DESCRIPTION OF THE DRAWINGS

Other characteristics and advantages of the invention appear from the following description of particular embodiments given as non-limiting examples, and described with reference to the accompanying drawings, in which:

FIGS. 10A and 10B show an example of a system for controlling the opening of a closure door that may be associated with the FIG. 9 enclosure, respectively in the closed position and in the open position;

FIG. 10C is a perspective view showing a detail of the opening control system of FIGS. 10A and 10B;

FIGS. 11A and 11B are diagrams showing an example of a sliding closure door respectively in its closed position and in its open position, and suitable for fitting to the enclosure of FIG. 9;

FIGS. 12A and 12B are diagrams showing an example of a pivoting closure door respectively in its closed position and in its open position, and suitable for fitting to the enclosure of FIG. 2;

FIG. 29 is a side view of the mechanism of FIG. 26;

FIGS. 30A and 30B show a detail of how a cartridge holder is mounted on the mechanism of FIGS. 26 to 29;

FIGS. 31A and 31B show a variant embodiment of the detail shown in FIGS. 30A and 30B.

DETAILED DESCRIPTION OF PARTICULAR EMBODIMENTS

Figure 1:
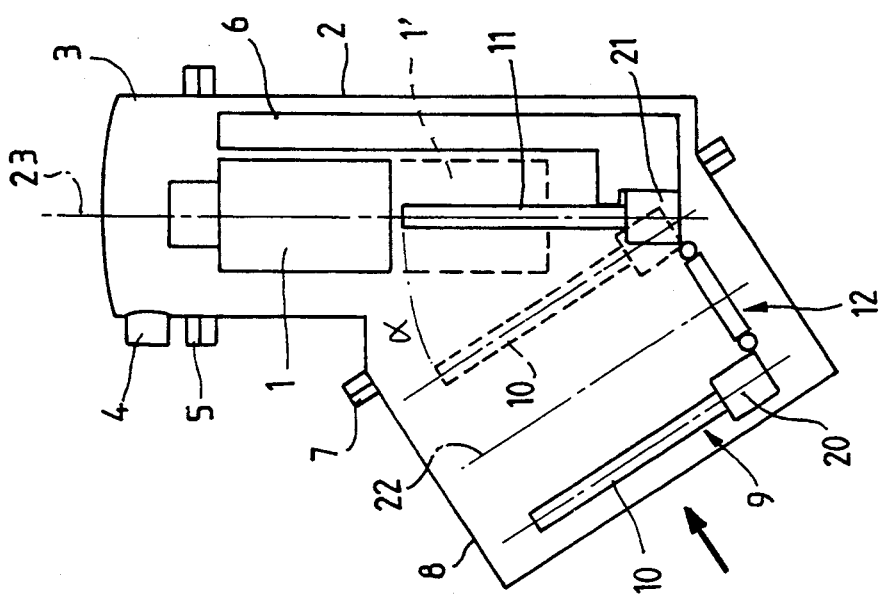
FIG. 1 is a diagrammatic axial section through an automatic space furnace fitted with a cartridge exchange device in accordance with the invention, and in which a batch of cartridges is inserted laterally.

We begin with FIG. 1 which shows an enclosure 2 of a space furnace defining a process chamber designed to be installed in a housing on board a satellite or a space station.

Reference 3 designates a dismountable portion of the enclosure 2 which is provided with sealed feedthrough members 4 and which is connected to the main body of the enclosure 2 by a flange connection 5.

A furnace 1 proper is inserted into the enclosure 2 when the portion 3 is dismounted, and it is mounted on a support device 6 which may, for example, include columns or a guide bedplate to enable the furnace 1 to move in translation along its longitudinal axis 23 so as to take up a position 1' shown in dashed lines in FIG. 1. The mechanism for moving the furnace 1 in translation along the support device 6 may itself be conventional.

A compartment 8 containing a batch of cartridges 10 and a mechanism for loading and unloading the cartridges 10 is also fitted to the main body of the enclosure 2, on one side thereof, and it is connected to the enclosure 2 by a flange connection 7.

In accordance with the invention, the batch of cartridges 10 is mounted inside the compartment 8 in cartridge holders 20 which are mounted so as to constitute a carousel 9, somewhat reminiscent of the cylinder of a revolver-type pistol. According to an essential feature, the axis of rotation 22 of the carousel 9 (to which the cartridges 10 are parallel while stored in the rest position in compartment 8) is at a predetermined angle relative to the longitudinal axis 23 of the furnace 1.

Figure 3:
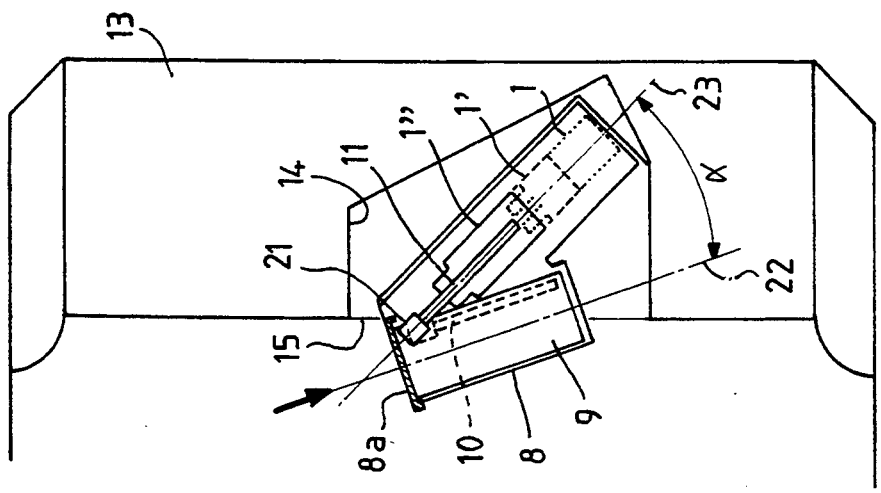
FIG. 3 is a diagrammatic axial section through a vertically mounted space furnace associated with a sloping cartridge exchange device in accordance with the invention.
Figure 4:
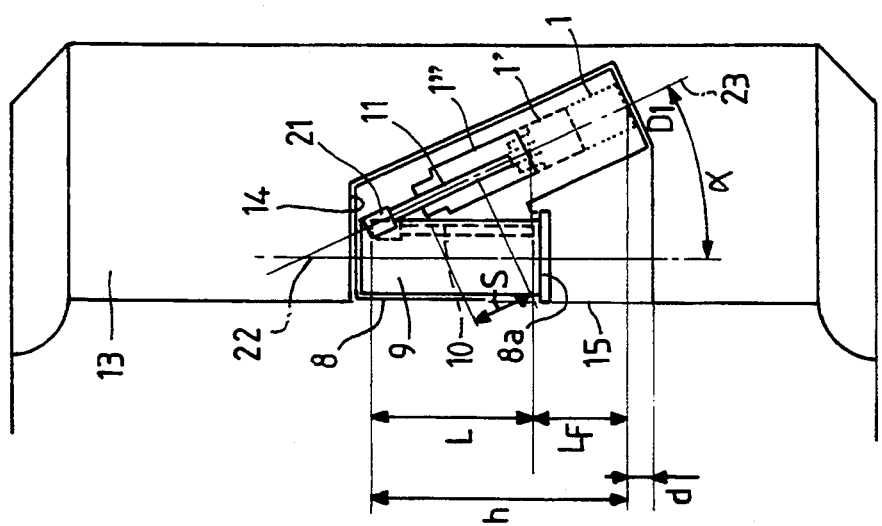
FIG. 4 is a diagrammatic axial section through a first example of an obliquely mounted space furnace associated with a vertical cartridge exchange device in accordance with the invention.
Figure 5:
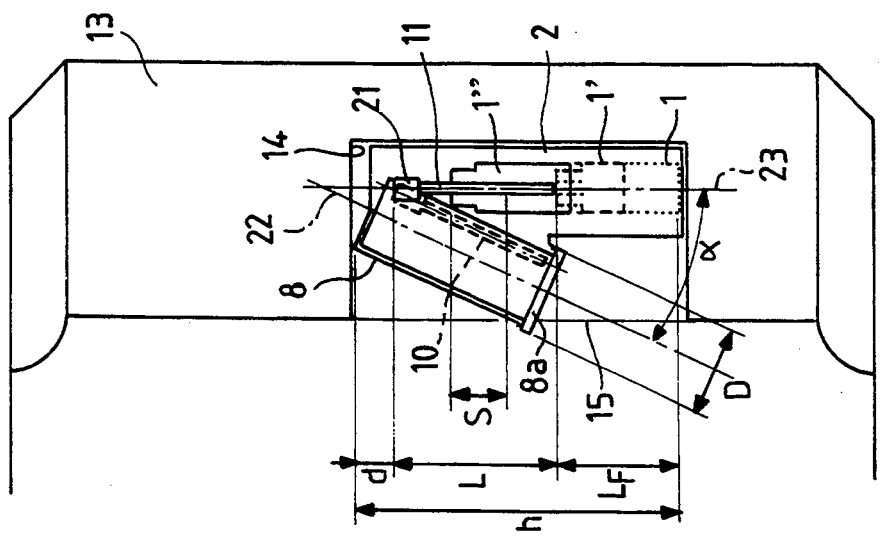
FIG. 5 is a diagrammatic axial section through a second example of an obliquely mounted space furnace associated with a vertical cartridge exchange device in accordance with the invention and within a process chamber that is itself capable of tilting to enable a batch of cartridges to be inserted.

This predetermined angle $\alpha 0$ referenced in FIGS. 3 to 5 advantageously lies in the range about 30° to about 50°.

Because of the special disposition beside the furnace 1 of the compartment 8 for storing the cartridges 10 in the immediate proximity of the furnace 1, the enclosure 2 may be very compact, and above all each cartridge 10 can be inserted very easily into the furnace 1 merely by tilting the cartridge holder 20 about an axis perpendicular to the axis 22 of the carousel and to the axis 23 of the furnace 1. The mechanism 12 for imparting indexed rotary drive to the carousel 9 for the purpose of bringing a new cartridge 10 into the vicinity of the furnace 1 co-operates with means that control tilting of the cartridge 10 through an angle equal to said predetermined angle $\alpha$ so as to bring the cartridge holder 20 and the cartridge 10 into a working position. When in the working position, the cartridge holder and the cartridge are given respective references 21 and 11 in the drawings. When the cartridge 11 is in alignment with the axis 23 of the furnace 1 after it has tilted from a position determined by the mechanism 12 for rotating the carousel, it suffices to position the cartridge 11 in the desired longitudinal position relative to the furnace 1 merely by moving the furnace 1 in translation along its support 6. In FIG. 1, a dashed outline represents a position 1' in which the cartridge 11 is practically completely engaged in the furnace.

Figure 2:
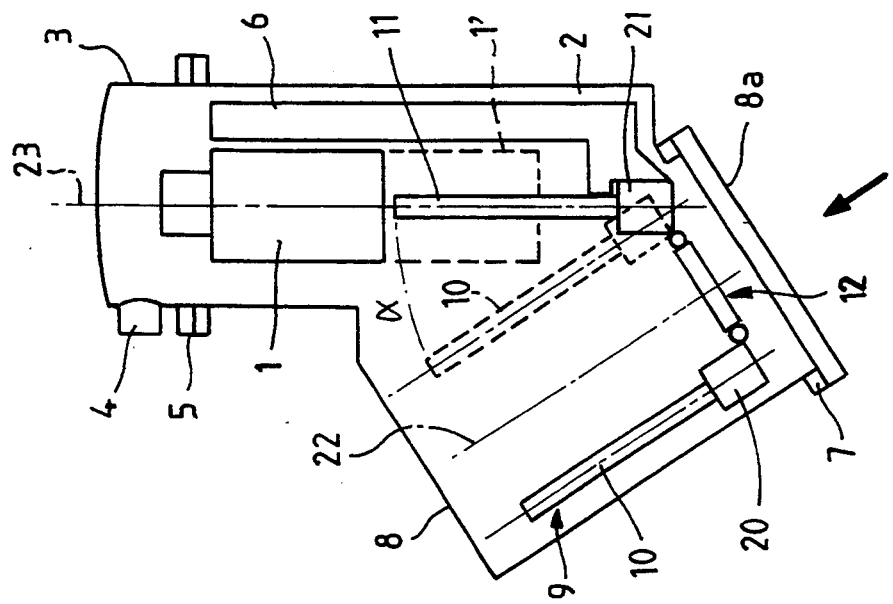
FIG. 2 is a diagrammatic axial section through an automatic space furnace fitted with a cartridge exchange device, in accordance with the invention, and in which a batch of cartridges is inserted axially.

FIG. 2 shows a simple variant embodiment in which the main body of the enclosure 2 also includes the compartment 8 that contains the carousel 9 and the batch of cartridges 10. In this case, a cover 8a is placed on the bottom portion of the compartment 8 to enable the batch of cartridges 10 and the carousel 9 to be inserted or removed axially.

FIGS. 3 to 5 show configurations that may be adopted in a space vehicle for an enclosure 2 containing a furnace 1, a compartment 8 for storing cartridges 10, together with a mechanism for moving the furnace in translation and a mechanism for imparting rotary drive to the carousel end for tilting a cartridge (not shown), the entire assembly constituting a process chamber.

The enclosure 2 is mounted through an opening 15 in a housing 14 in a wall 13 of a space vehicle.

In FIG. 3, the furnace 1 is placed vertically, i.e. parallel to the wall 13, while the compartment 8 and the carousel it contains slope at a predetermined angle $\alpha$ relative to the wall 13.

In the configuration of FIG. 3, the total height h of the enclosure 2 must be such that:

$$h > L + L_f + d$$

with $d = D.\sin \alpha$ where:
L = the length of a cartridge;
$L_f$ = the Length of the furnace, i.e. about 80% of L, in practice;
D = the diameter of the compartment 8 containing the carousel 9;
$\alpha$ = the angle of inclination of the carousel.

Figure 7:
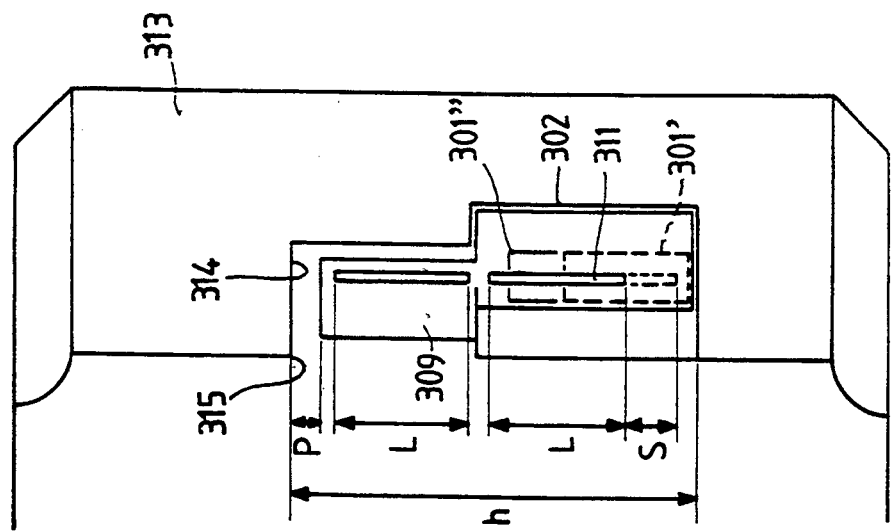
FIG. 7 is a diagrammatic axial section view through a vertical space furnace associated with a prior cartridge exchange device placed in line with the furnace.
Figure 6:
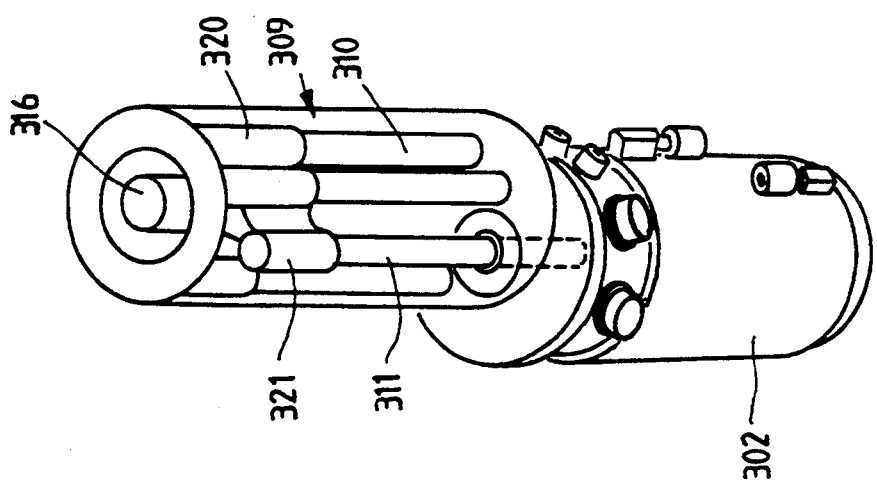
FIG. 6 is a perspective view of a space furnace associated with a prior art cartridge exchange device.

It can be seen that the minimum height h for the configuration of FIG. 3 is about 20% smaller than the minimum height that is required in a conventional configuration as shown in FIG. 7. In particular, the stroke s of the furnace 1 between its extreme positions 1' and 1" during treatment of a sample, e.g. for the purpose of achieving solidification, no longer contributes to determining the minimum height for the housing 14.

In FIGS. 4 and 5, the compartment 8 and the carousel 9 that it contains are disposed vertically, i.e. parallel to the wall 13 of the space vehicle, whereas the furnace 1 slopes at an angle $\alpha$ relative to the axis 22 of the carousel 9.

In the configurations of FIGS. 4 and 5, the total height h of the enclosure 2 and of the housing 14 must be such that:

$$h > (L + L_f).\cos \alpha + d \text{ with } d = D_1.\sin \alpha$$

where:
L = the length of the cartridge;
$L_f$ = the length of the furnace, i.e. about 0.8 L;
$D_1$ = the radius of the main body of the enclosure 2 containing the furnace 1;
$\alpha$ = the angle of inclination of the furnace 1 relative to the carousel 9.

In the configuration of FIGS. 4 and 5, the minimum height h may be about 30% smaller than the minimum height required for a conventional configuration as shown in FIG. 7, and here again the height saving can be taken to be greater than the stroke s of the furnace 1.

By way of example, parameters for the configurations of FIGS. 3 to 5 and 7 may have the following typical values:

| | |
|---|---|
| L = 400 mm | P = 100 mm |
| $L_f$ = 300 mm | D = 200 mm |
| s = 120 mm | $D_1$ = 150 mm |
| $\alpha$ = 30° | |

Under such circumstances, the minimum values of the height h are respectively: $h_1$ = 800 mm for the configuration of FIG. 3; $h_2$ = 680 mm for the configuration of FIGS. 4 and 5; and $h_3 = 1020$ mm for the configuration of FIG. 7.

Between missions, the cartridges 10 can be loaded or unloaded relative to the carousel 9 and the compartment 8 in a very wide variety of ways. Thus, in the embodiments of FIGS. 3 and 4, the cartridges 10 may be installed in the compartment 8 or withdrawn therefrom by removing a cover 8a situated at the end opposite from the cartridge holders, so that the cartridges can be handled without having to pass through the cartridge holders.

In contrast, in the embodiment of FIG. 5, where the entire enclosure 5 can tilt relative to the housing 14, or in the embodiment of FIG. 2, the cover 8a is situated adjacent to the cartridge holders 20, such that loading and unloading a batch of cartridges 10 between two treatment sequences takes place through the cartridge holders 20.

Figure 8:
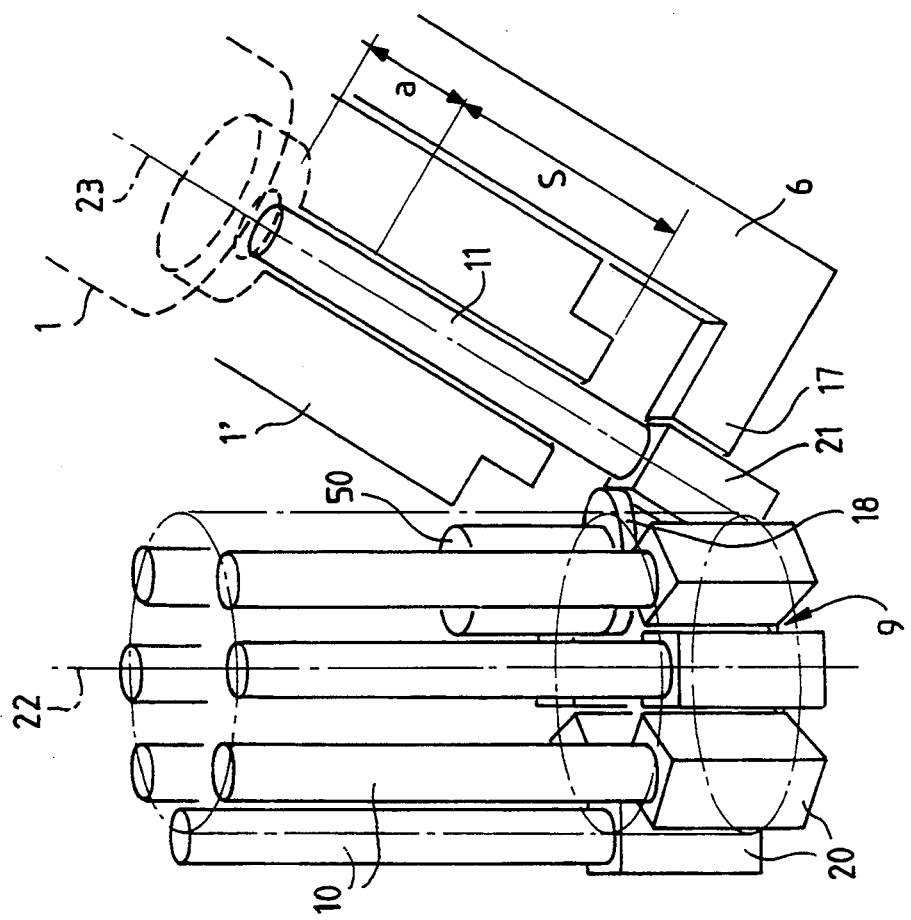
FIG. 8 is a perspective view showing an operation of loading a space furnace from a furnace loader device of the invention.

FIG. 8 shows a cartridge exchange device of the invention in a position such that a cartridge to be treated is mounted in its working position 11 in alignment with the axis 23 of the furnace 1.

The carousel 9 carries a set of cartridge holders 20 (e.g. 6 to 32 holders) in which the cartridges 10 containing the samples to be treated are removably engaged. The cartridges 10 are locked to the cartridge holders 20 by conventional locking means, e.g. using balls, not shown in the drawing. The connection between a cartridge 10 and its supporting holder 20 further includes an electrical connector to enable connections to be made with measurement sensors incorporated in the cartridge.

A single electric motor 50 imparts drive to the mechanism for rotating the carousel 9. When a cartridge to be treated and stored in the carousel 9 comes close to a plane defined by the axis of rotation 22 of the carousel 9 and the longitudinal axis 23 of the furnace 1, the mechanism for imparting rotary drive to the carousel 9 co-operates with cartridge tilting means, thereby automatically causing the holder 21 of the cartridge to be treated 11 to tilt into the treatment position shown in FIG. 8, the axis of the cartridge then coinciding with the axis 23 of the furnace 1.

Positioning accuracy may be defined by accurate guide surfaces such as complementary V-portions disposed respectively on the holder 21 of the cartridge to be treated and on the end 17 of the support 6 on which the furnace drive mechanism is mounted.

Examples of the mechanism for controlling rotation of the carousel 9 and tilting of the cartridge holders 20 are described below.

When a cartridge 11 is in the treatment position, an electrical connector placed on the cartridge holder 21 is automatically brought into contact with a corresponding electrical connector placed on the end 17 of the support 6. However, in a variant, it is also possible to associate each cartridge with a flexible cable connected to a rotary contactor having the same axis as the carousel 9 and co-operating with the electrical connector placed on the end 17 of the support 6.

When a cartridge to be treated 11 is tilted by the action of the tilting mechanism on the cartridge holder 21, the furnace 1 is in its remote position as shown in dashed lines in FIG. 8. The mechanism for driving the furnace in translation (which mechanism may be conventional) moves the furnace through a first stroke a which enables the cartridge to be treated 11 to be partially inserted into the furnace 1. This stroke a may typically be 100 mm to 200 mm. When the treatment corresponds to oriented solidification of a sample, the furnace 1 is heated to begin melting the material contained in the cartridge 11. The furnace 1 then moves down along the stroke s which may be of the order of 100 mm to 200 mm, for example, until it reaches the position 1' shown in continuous lines in FIG. 8, thereby melting the material to be melted. The furnace then moves back from its position 1' to the position defined by the stroke s, thus causing oriented solidification of the material. The furnace is then cooled and returned to its dashed line position 1 in FIG. 8 over an additional stroke a enabling the cartridge 11 to be withdrawn and brought back to a position parallel to the axis 22 of the carousel by tilting the cartridge holder 21. After the carousel 9 has rotated through a fraction of a turn to bring another cartridge 10 into the vicinity of the plane defined by the axes 22 and 23, the tilting and treatment process can be begun again with this other cartridge.

It will be observed that witch a space furnace, all of the various motions of the cartridges and of the furnace are very slow, thereby having very little repercussion on the attitude of the space vehicle on which the furnace is placed. The slowness of the motion in weightlessness, plus the fact that the centers of gravity of the components of the cartridge exchange device move very little, make it possible to reduce the stresses to which the mechanical components are subjected, and in addition to increasing reliability, this makes it possible to reduce the total mass of these various components plus the energy source used for driving the mechanism, thereby obtaining savings in the operation of putting them into orbit.

Figure 9:
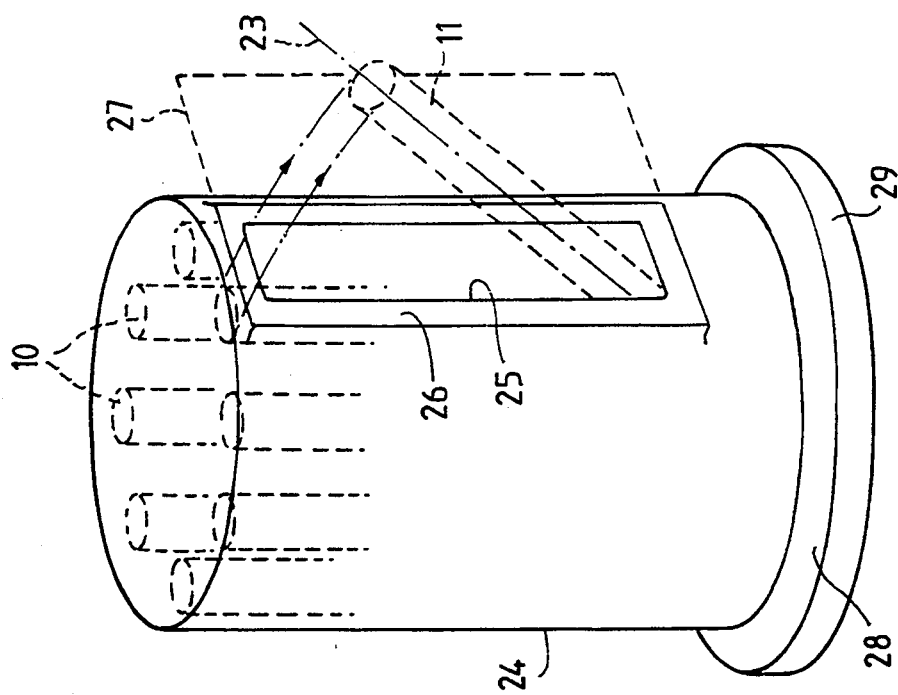
FIG. 9 is a perspective view showing a furnace loader device of the invention placed in an enclosure fitted with a closable opening.

FIG. 9 shows a particular embodiment in which the carousel 9 is enclosed in a hermetic compartment 24 containing the set of cartridge holders 20 together with the cartridges 10. An oblong side opening 25 whose midline corresponds to the plane defined by the axis of rotation of the carousel and the axis 23 of the furnace enables a cartridge to be treated 11 to move into the tilted position. The opening 25 is selectively closed by a moving panel 27 that bears against a sealing surface 26 surrounding the opening 25. During transport, the panel 27 is closed and prevents toxic substances contained in the cartridges from escaping to the outside in the event of an accident. When the carousel 9 is loaded in the process chamber 2 (FIGS. 1 to 5), the panel 27 is opened to enable the cartridges to be extracted. Sealing between the process chamber and the carousel 9 is obtained by a flange 29 bearing against a sealing ring 28, for example.

The panel 27 may operate by sliding (FIGS. 11A and 11B) or by pivoting (FIGS. 12A and 12B). For a panel 27 to pivot about a hinge 30, a return spring is advantageously associated with the hinge 30 to urge the panel 27 towards its closed position.

FIGS. 10A to 10C show an example of a mechanism for controlling opening of a panel 27 that is movable in translation and that is mounted on a hermetic compartment 24 containing a carousel 9.

In FIGS. 10A and 10B, the compartment 24 of FIG. 9 is represented symbolically by a dashed square outline. FIG. 10A shows the compartment 24 and the panel 27 in the closed position immediately before being loaded into the hermetic enclosure 2 (FIGS. 1 to 5) constituting the process chamber. A wheel 31 secured to the furnace support 6 (FIG. 2) comes into contact with the mechanism for opening the panel 27 by moving it in translation as the compartment 24 is being installed inside the enclosure 2. FIG. 10B shows the compartment 24 after it has been loaded into the enclosure 2, with the panel 27 opened by the action of the wheel 31 on the mechanism for opening the panel 27.

The panel-opening mechanism shown in FIGS. 10A and 10B comprises two links 33 and 40 forming a parallelogram linkage hinged to the panel 27 (hinges 36 and 38 respectively) and to the sealed compartment 24 (hinges 37 and 39 respectively). The link 40 co-operates with a return spring 41 fixed on the compartment (reference 42) and on the link 40 (reference 43). The link 33 is itself controlled by a control finger 30 co-operating with the wheel 31. The control finger 30 may comprise a body 32 hinged about a hinge 37 connected by means of a spring 34 to the link 33 and extended by a rod 35 coming into contact with the wheel 31 (see FIG. 10C showing the control finger 30 in an intermediate position between the positions of FIGS. 10A and 10B).

Figure 13:
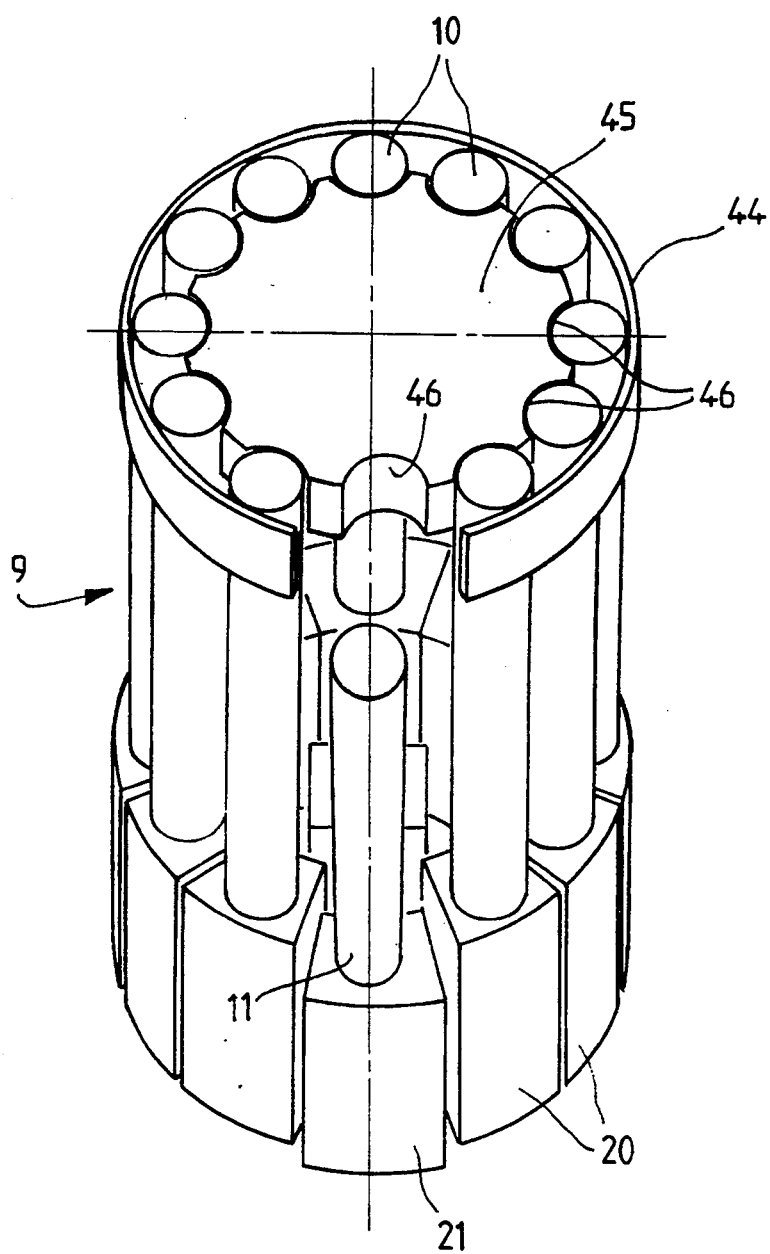
FIG. 13 is a perspective view showing an implementation of a shock absorber device in a cartridge exchange device of the invention.

FIG. 13 shows a shock absorber device that may be installed to prevent vibration appearing in the carousel 9 during transport. A central wheel 45 is lined with resilient material and is rotated by the mechanism for rotating the carousel 9. It is disposed between the cartridges 10 at the end thereof that is opposite from the cartridge holders 20. Indentations in the form of concave cylindrical housings 46 are formed in the periphery of the wheel 45 for receiving the ends of the cartridges 10 which also make contact with a stationary outer cylindrical strip 44 situated in the same radial plane as the wheel 45. The cylindrical strip 44 forming an outer band has a gap in the zone through which a cartridge 11 is tilted in order to reach the working position.

There follows a more detailed description of various examples of mechanisms for controlling rotation of the carousel and tilting of a cartridge into the working position.

In accordance with the invention, a single rotary control assembly is provided that is driven by an electric motor and that acts in succession on all of the cartridge holders 20.

FIG. 14 and FIGS. 16A to 16C show a mechanism 18 for controlling rotation of the carousel and for locking it in successive working positions, which mechanism is of the Maltese cross type.

The electric motor 50 rotates a member including a finger 47 and a cam 49. The finger 47 serves to drive the cartridge holders 20 in rotation and it engages in grooves 51 formed at the bottoms of the cartridge holders 20. When the finger 47 leaves the grooves 51 (FIG. 16C) the cam 49 in the form of a circular sector mounted on the drive plate for the finger 47 locks in place the cartridge holder 21 for the cartridge 11 that is in the working position. The cam 49 for providing locking in the working position co-operates with a recess 48 which is formed in the cartridge holder 20 and which may be toroidal in profile having an axis that is the axis of rotation of the cartridge. This enables the locking cam 49 to remain permanently in contact with the recess 48 while the cartridge is being tilted, and thus enables it to continue to perform the locking function regardless of the angle through which the cartridge holder 20 is tilted.

The cartridge holder 20 is tilted into its working position 21 by means of a short drive system whose initiator member is secured to the rotary assembly comprising the finger 47 and the cam 49. The initiator member may be cam, a lever, or an electrical switch acting on the drive system by means of an electromagnet, or it may include a motor 250 (which corresponds to the embodiment of FIGS. 22 and 23 described below).

Figure 16C:
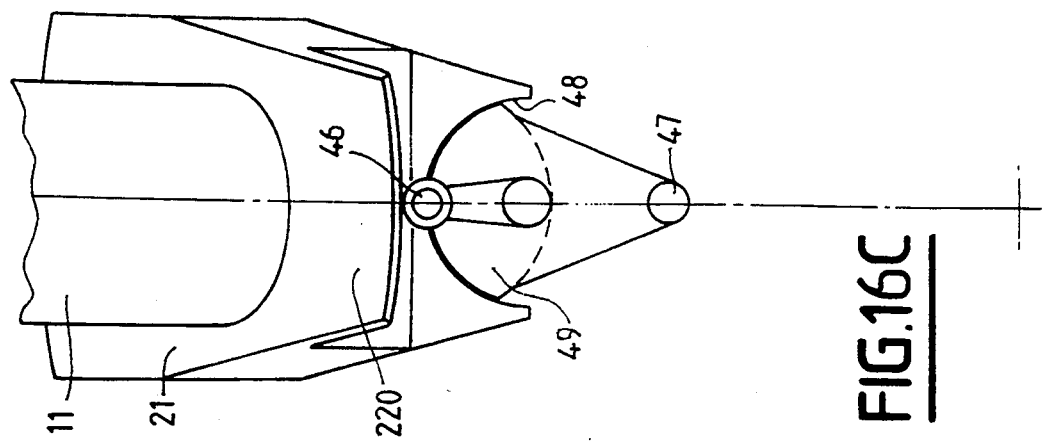
FIGS. 16A, 16B, and 16C are plan views showing three successive positions of a portion of the FIG. 14 control mechanism.

In the embodiment of FIGS. 16A to 16C and FIG. 14, a wheel cam 46 is driven directly by the motor 50 and co-operates with shaped portions 220 formed at the top portions of the cartridge holders 20. Once the finger 47 has escaped from a groove 51 and the cam 49 has begun to co-operate with the groove 48 of another cartridge holder that is to come into the working position, rotation of the cartridge holders 20 is interrupted but, as the motor 50 continues to rotate, the cam 46 acting on a shaped portion 22 formed at the top of cartridge holder 21 causes the axis of the cartridge 11 to be tilted, thereby bringing the cartridge into the working position (FIG. 16C). Contact between the wheel cam 46 and the shaped portion 220 is ensured by a return spring (not visible in FIGS. 16A to 16C) that exerts a small force in order to limit the microaccelerations that may occur in microgravity.

Figure 16B:
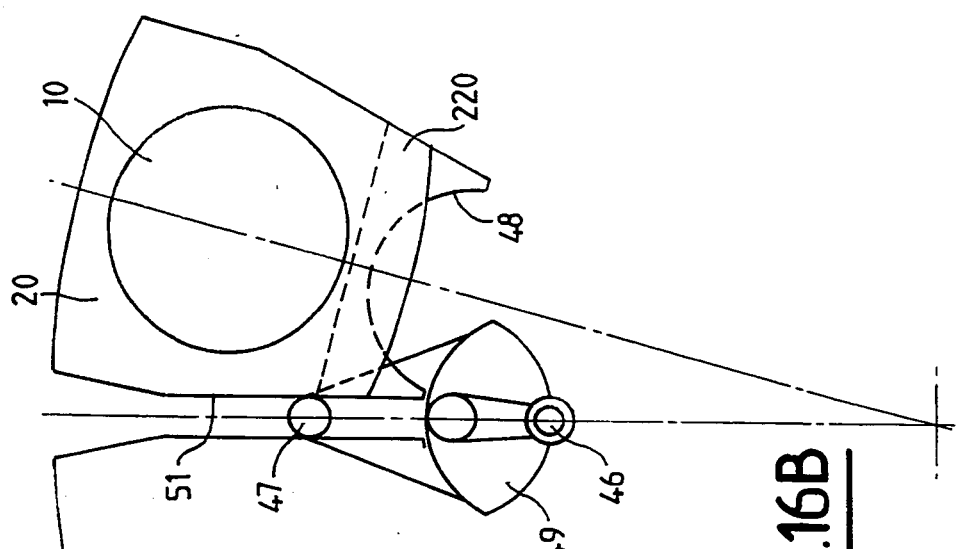
Figure 16A:
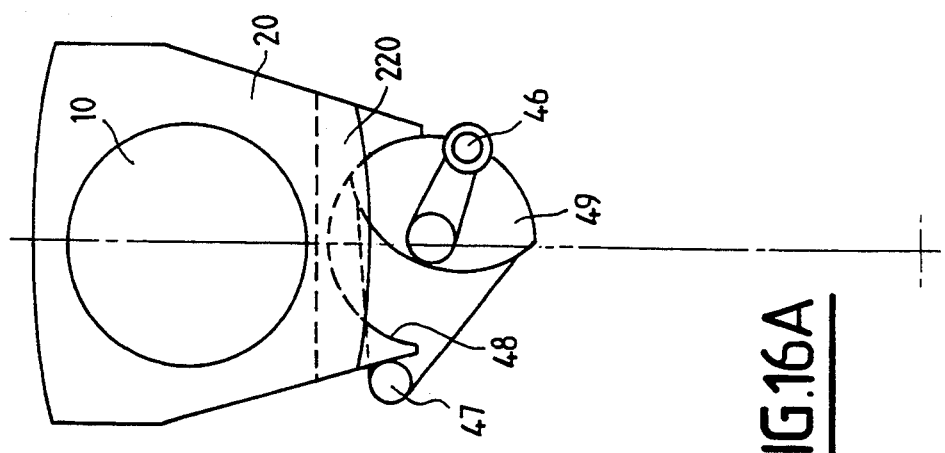
Figure 17:
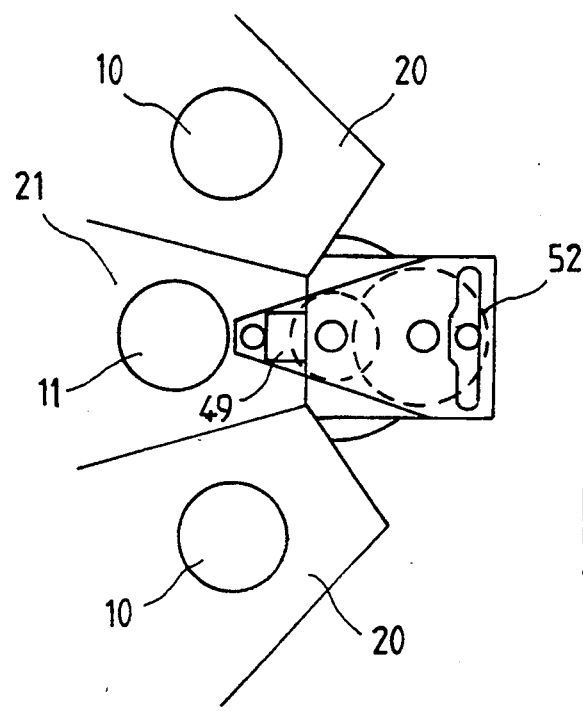
FIGS. 17 and 18 are a plan view and an elevation view of another particular embodiment of a slider type mechanism for controlling rotary drive of the carousel and tilting of the cartridge.

In the sequence shown in plan view in FIGS. 16A to 16C, FIG. 16A corresponds to the moment when the finger 47 begins to drive a cartridge holder 20 and cause the entire carousel to rotate, FIG. 16B corresponds to the moment when the cartridge holder 20 of FIG. 16A and the following cartridge holder are in intermediate positions, and FIGS. 16C shows the cartridge holder 21 adjacent to the cartridge holder 20 of FIG. 16A in its working position, where it is locked in place via its bottom portion by the cam 49 while the wheel cam 46 has caused the cartridge holder 21 to tilt.

Figure 14:
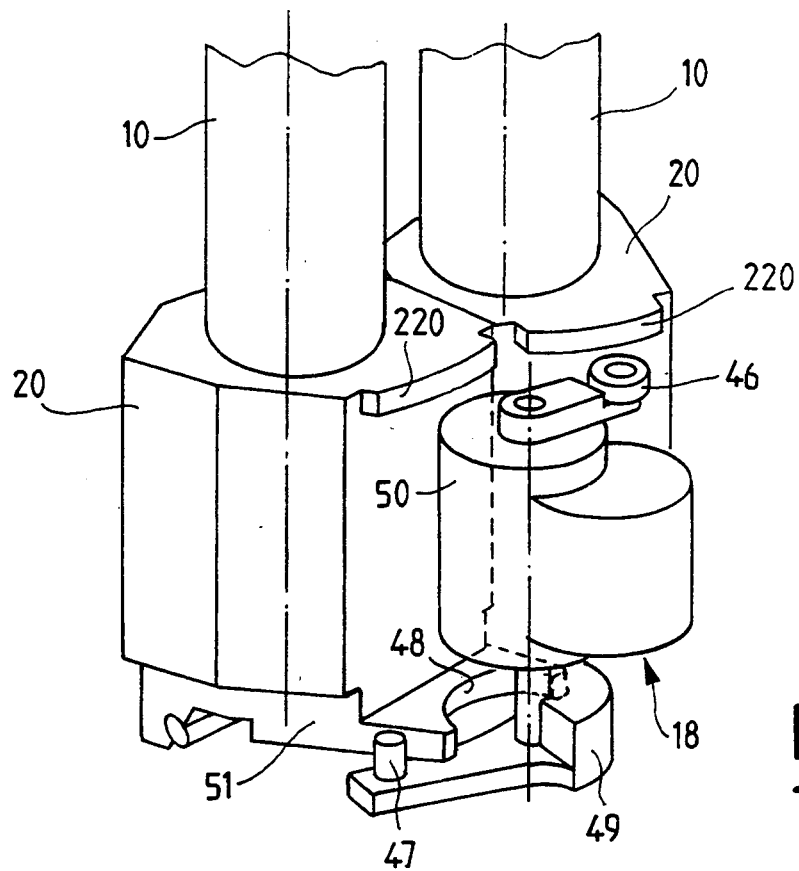
FIG. 14 is a perspective view of a particular embodiment of a mechanism for controlling rotary drive of the carousel and tilting of the cartridge using an electric motor having its axis parallel to that of the carousel.
Figure 15:
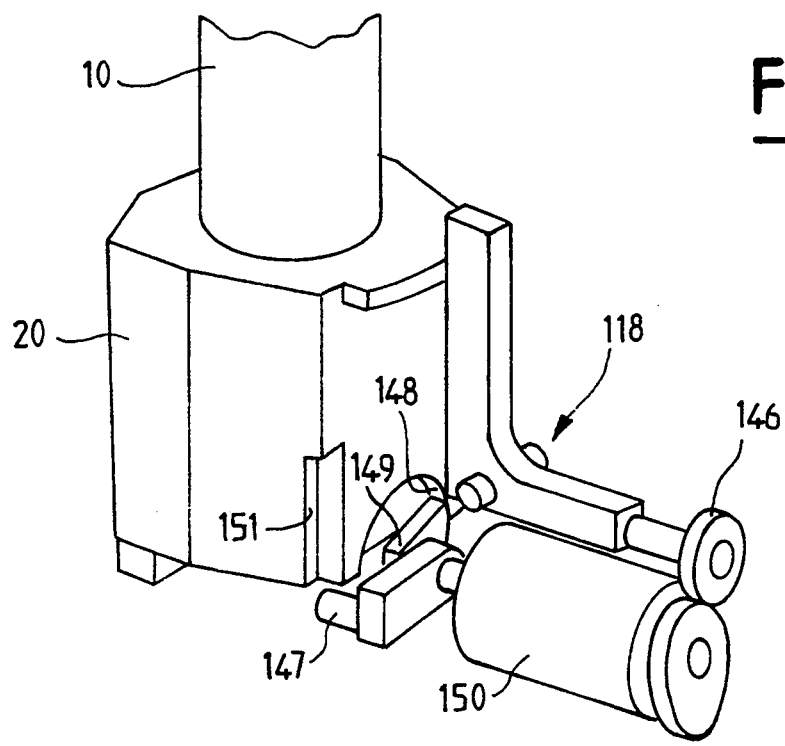
FIG. 15 is a perspective view of a particular embodiment of a mechanism for controlling rotary drive of the carousel and tilting of a cartridge using an electric motor whose axis is perpendicular to and intersects that of the carouse.

FIG. 15 shows a variant rotary control mechanism 118 in which the controlling electric motor 150 does not have a vertical axis, i.e. an axis parallel to the axis of rotation of the carousel, as does the motor 50 in FIG. 14, but has a horizontal axis that intersects the axis of rotation of the carousel. Elements 146 to 151 in FIG. 15 perform functions that correspond to those of elements 46 to 51 in FIG. 14. In FIG. 15, the Maltese cross is situated in a vertical plane. The cam 146 situated at the end of the shaft of the motor 150 opposite from its end that drives the finger 147 co-operating with the vertical groove 151 and the cam 149 co-operating with the groove 148 causes the cartridge holder 20 to be tilted by a bell-crank mechanism.

Figure 18:
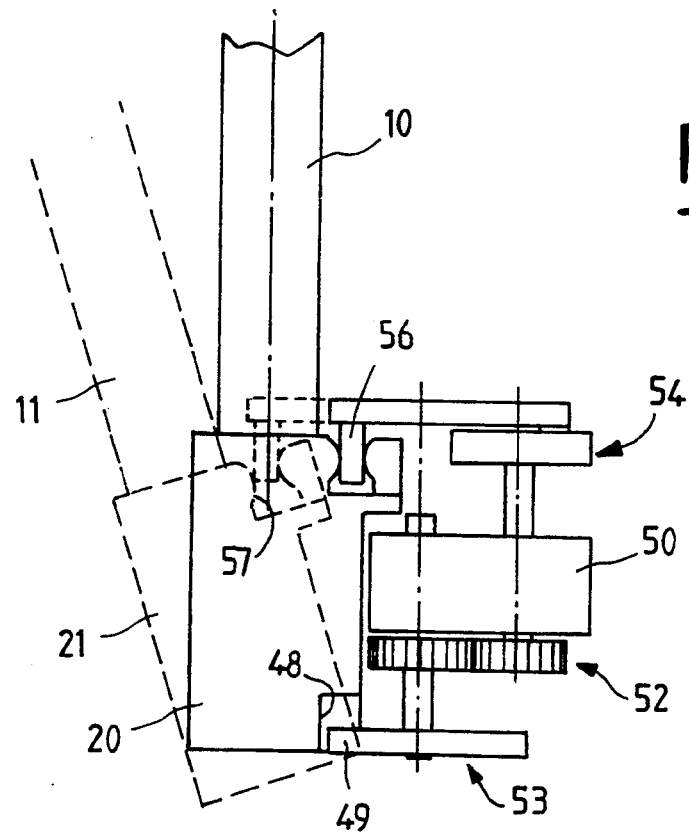
Figure 19:
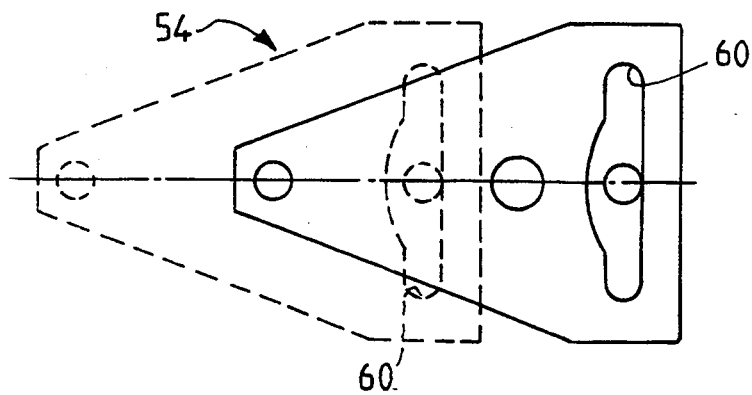
FIGS. 19 and 20 are a plan view and an exploded perspective view of a portion of the mechanism shown in FIGS. 17 and 18.
Figure 20:
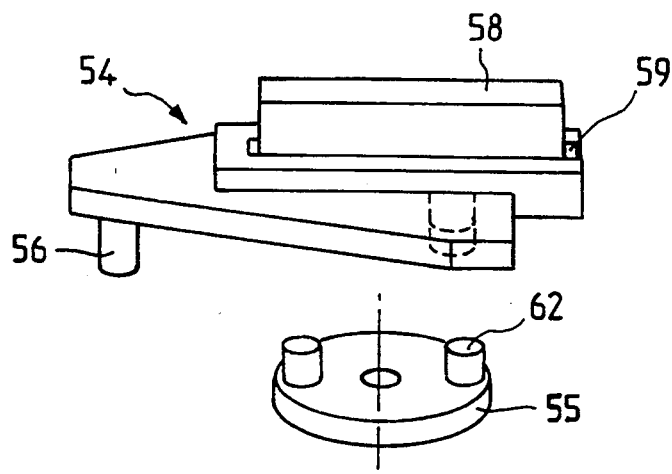

FIGS. 17 to 20 correspond to a variant embodiment of the mechanism of FIGS. 14 and 16A to 16C for controlling rotation and tilting. In the embodiment of FIGS. 17 to 20, the bottom Maltese cross 53 driven by the electric motor 50 via a stepdown gear system 52 may be entirely similar to that described with reference to FIG. 14. In contrast, in the example shown in FIGS. 17 to 20, the cartridge holder 20 is tilted not by a cam and spring system, but by a slider 54 that accompanies the motion of the cartridge holder 20. The slider 54 essentially comprises a plate provided with a shaped transverse slot 60 that receives an eccentric finger 52 formed on a plate 55 driven by the electric motor 50 via its end opposite from the Maltese cross 53. At its end portion situated facing the cartridge holder 20, the slider 54 also has a finger 56 co-operating with a groove 57 in the cartridge holder 20 to cause it to tilt (FIGS. 18 and 20). The top portion of the slider 54 may also have a groove 59 for receiving a guide 58 (FIG. 20).

Figure 23:
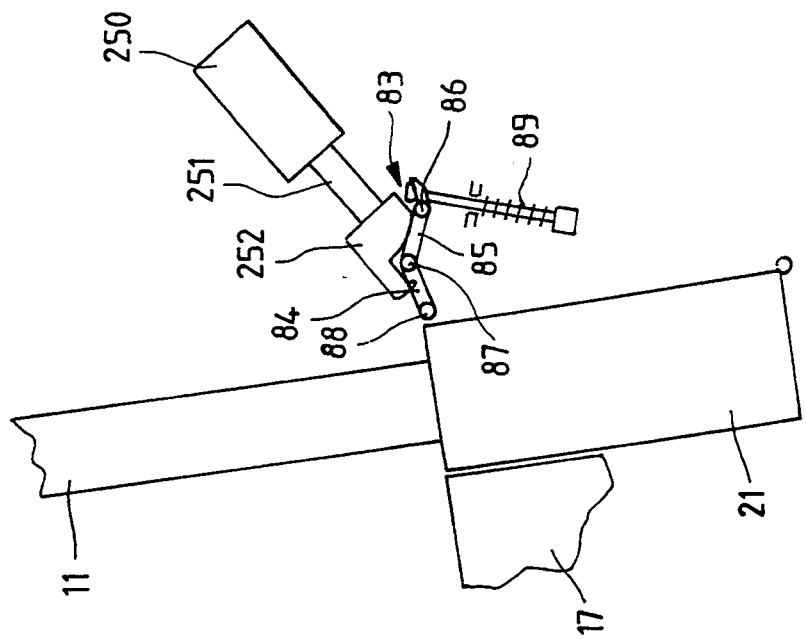
FIGS. 22 and 23 are elevation views showing two different positions of another example of the mechanism for controlling cartridge tilting and applicable to the cartridge exchange device of the invention.
Figure 22:
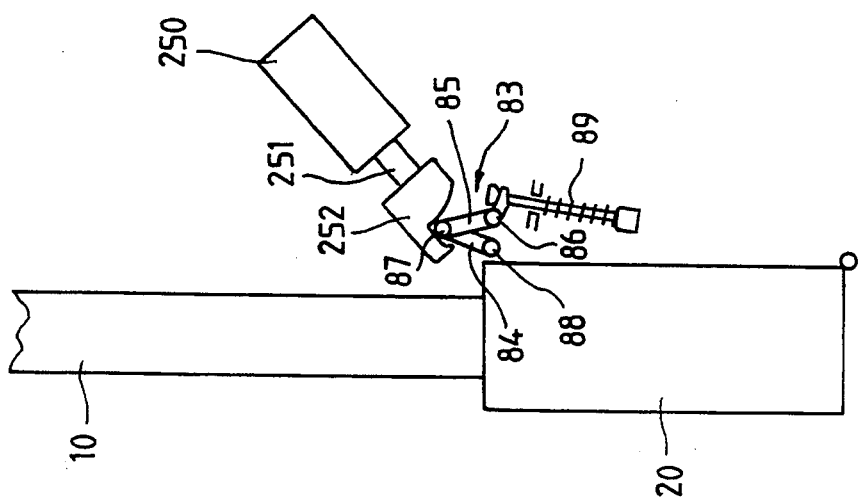

FIGS. 22 and 23 show yet another embodiment of the mechanism for tilting a cartridge by acting on a cartridge holder 20. In this case, an electric motor 250 controlled by contacts that are closed synchronously with rotation of the carousel to cause selective tilting of a cartridge drives a screw 251 that acts on an actuator 252 for tilting a cartridge holder by means of a toggle mechanism 83. The toggle mechanism comprises links 84 and 85 hinged about axes 86, 87, and 88, and associated with a return spring 89. FIG. 22 shows a cartridge 10 in the storage position with the actuator 252 retracted and the toggle mechanism 83 folded up, while FIG. 23 shows a cartridge 11 in the working position with the actuator 252 deployed and the toggle 83 locked with the return spring 89 compressed.

FIGS. 26 to 29 show a particular embodiment of the cartridge holder 20 for co-operating with a mechanism for controlling rotation of the carousel 9 and tilting of the cartridge of the same type as that described with reference to FIGS. 14 and 16A to 16C, and more particularly adapted to receive an electrical connector of the kind described below with reference to FIG. 21.

Figure 26:
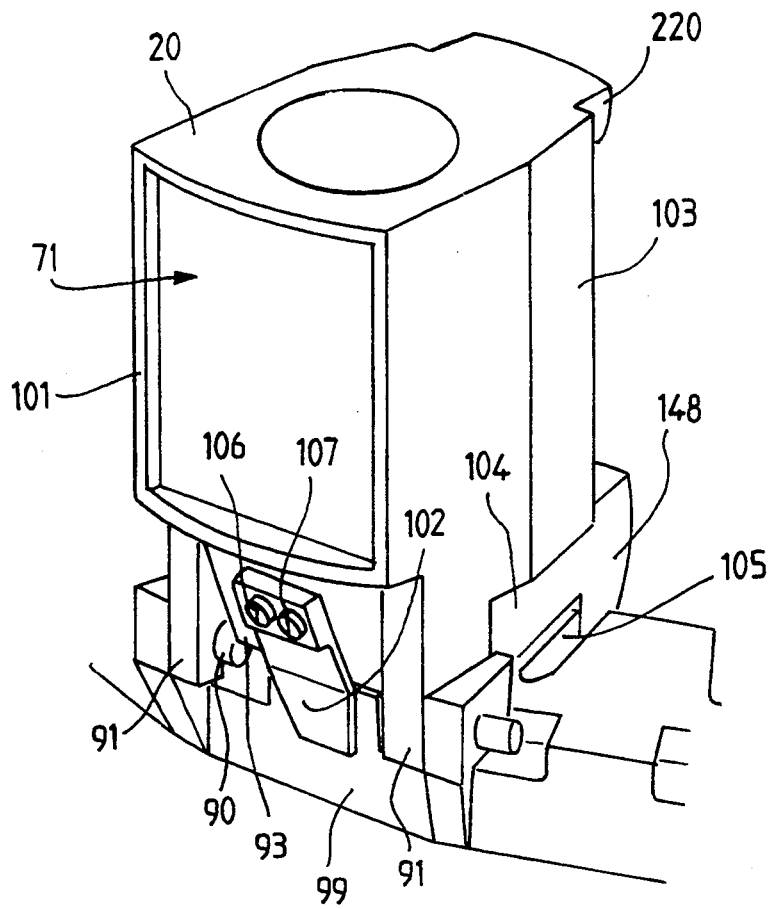
FIG. 26 is a perspective view of another example of a mechanism for controlling cartridge tilting that is applicable to the cartridge exchange device of the invention.
Figure 27:
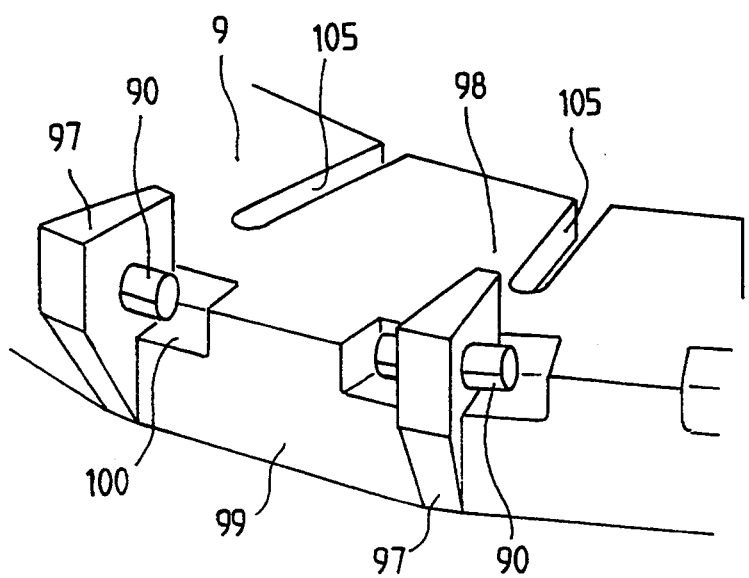
FIG. 27 is a perspective view of a portion only of the mechanism of FIG. 26.

FIG. 26 shows a cartridge-supporting holder 20 mounted in hinged manner on a carousel 9. The cartridge holder has two lateral tabs 91 in its front portion each provided with a housing 93 open via an outlet slot 93a (see detail of FIGS. 30A and 30B) for engaging on stub axles 90 mounted on parts 97 that co-operate with the tabs 91 in order to ensure lateral centering of the cartridge holder 20. The parts 97 are fitted to the carousel 9 proper and they form a ring having a top face 98 on which the cartridge holders 20 stand and having radial notches 105 formed on the inside to perform the function of the notches 51 in FIG. 14 by receiving the finger of the rotary drive mechanism. Flats 100 are formed in the carousel 9 to pass the tabs 91 of the cartridge holders 20 and enable them to be mounted on the stub axles 90. The front face 99 of the carousel 9 serves as a bearing face for return spring blades 102 that are removably fixed by means of screws 106, 107 on a sloping bearing face 108 situated at the front of the cartridge holders 20 and serving to impart prestress to the spring 102 (FIG. 29).

Figure 28:
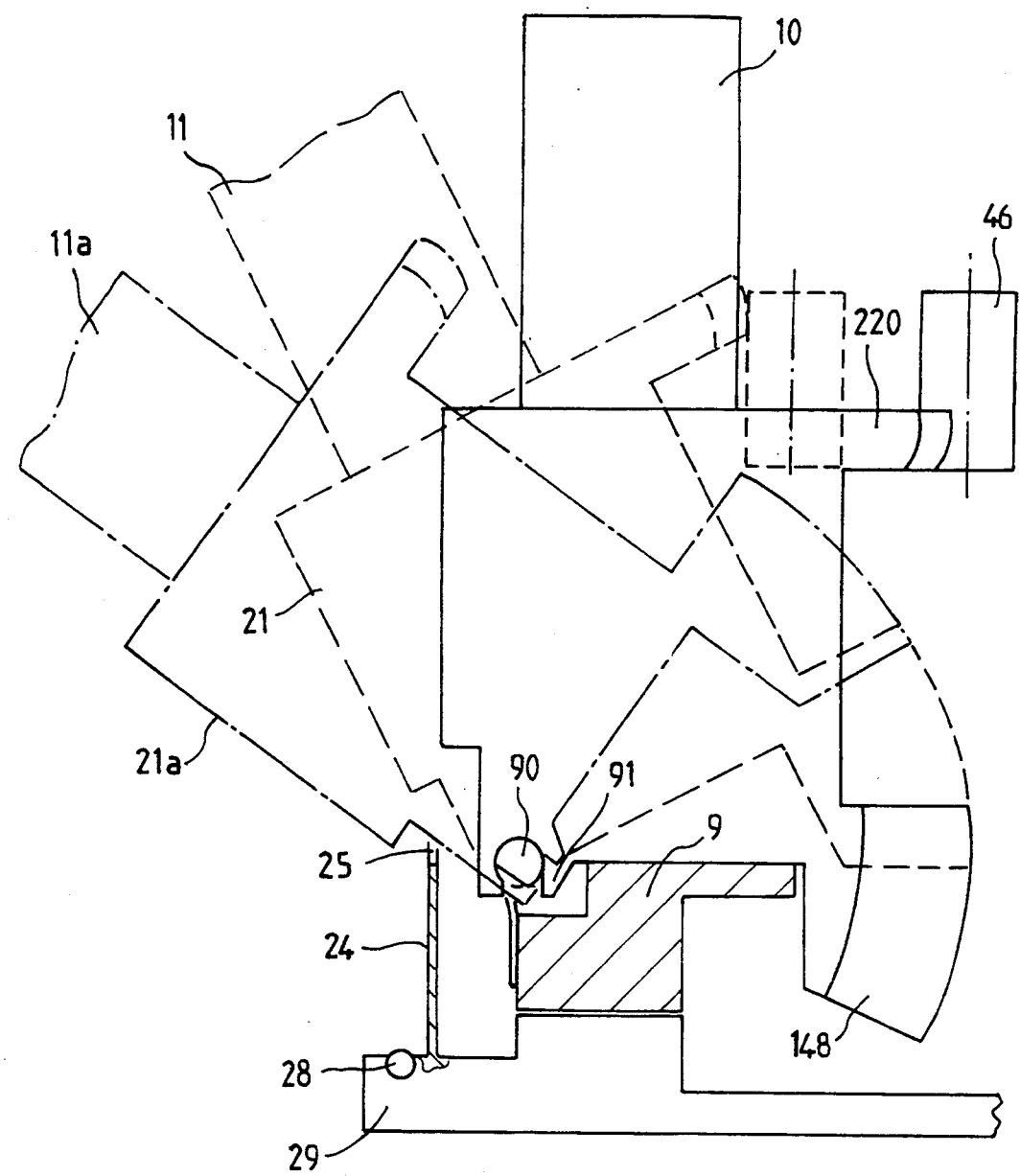
FIG. 28 is a diagrammatic view, partially in section showing various positions of a cartridge co-operating with the mechanism of FIG. 26.

FIGS. 26, 28, and 29 show the shape of a toroidal cam 148 that performs the function of the recess 48 in FIG. 14 and that is suitable for co-operating with a cam of appropriate shape corresponding to the cam 49 in FIG. 14.

FIGS. 28 and 29 show a cartridge holder in the rest position (reference 20) and also in the working position (reference 21 and shown in dashed lines). The rear upper portions 220 of the cartridge holders 20 co-operate with a tilting control cam 46 as in FIG. 14.

FIG. 28 also shows the position 11a, 21a of a cartridge and of its cartridge holder during loading or extraction through the opening 25 of the storage compartment 24.

FIGS. 30A and 30B show a basic version in which the stub axles 90 are formed on the carousel 9. However, in a variant, as shown in FIGS. 31A and 31B, there can be seen a stub axle 92 formed on the cartridge holder 20 and co-operating with an open housing 95 formed in the carousel 9 for receiving the stub axle. Under such circumstances, an additional curved portion 94 is formed in the tab 90 of the cartridge holder 20 to engage in a corresponding housing 96 formed in the carousel 9 and serving as a guide.

With reference again to FIG. 26, it can be seen that a cartridge holder has side faces 103 that project, thereby enabling the various cartridge holders to bear against one another, and that it has bottom portions 104 of its side faces that are set back in order to enable the rotation-controlling finger to bear thereagainst. A flat connector 71 is also disposed on the front face of each cartridge holder 20 inside a protective frame 101 that co-operates with the wall of the hermetic compartment 24 (FIGS. 9 and 28) to protect the connectors of the stored cartridges against pollution in the event of an accident in the furnace.

Figure 21:
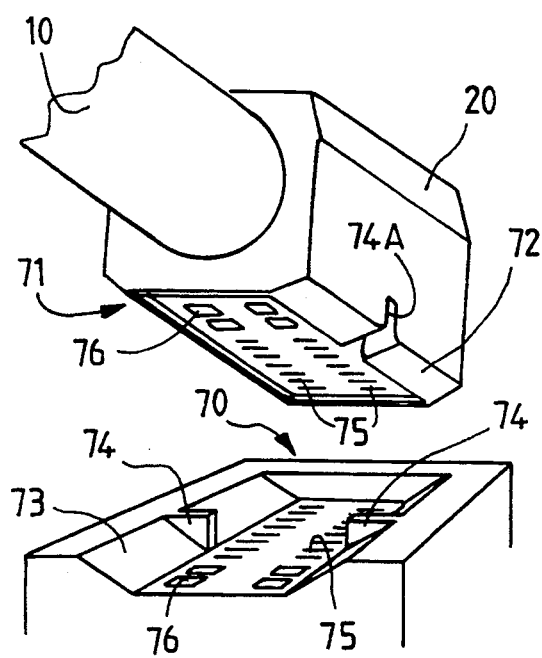
FIG. 21 is a perspective view of an electrical connection device applicable to the cartridge exchange device of the invention.

FIG. 21 shows an example of a flat electrical connector 71 formed on a cartridge holder 20 and co-operating with a connector 70 formed on the support 6 of the furnace displacement mechanism.

Each of the connectors 71 and 70 comprises: complementary V-shaped lateral centering elements 72 and 73 respectively; at least one axial centering element 74 and 74A respectively; low current electrical contact 75; and higher current electrical contacts 76. The electrical connectors 70 and 71 engage each other only when the cartridge holder 20 is placed in its tilted position. The contacts 75 and 76 may be implemented, for example, by metal-plated surfaces on a printed circuit for the connector 71 and by flexible eyelash-like wires for the connector 70.

Figure 25:
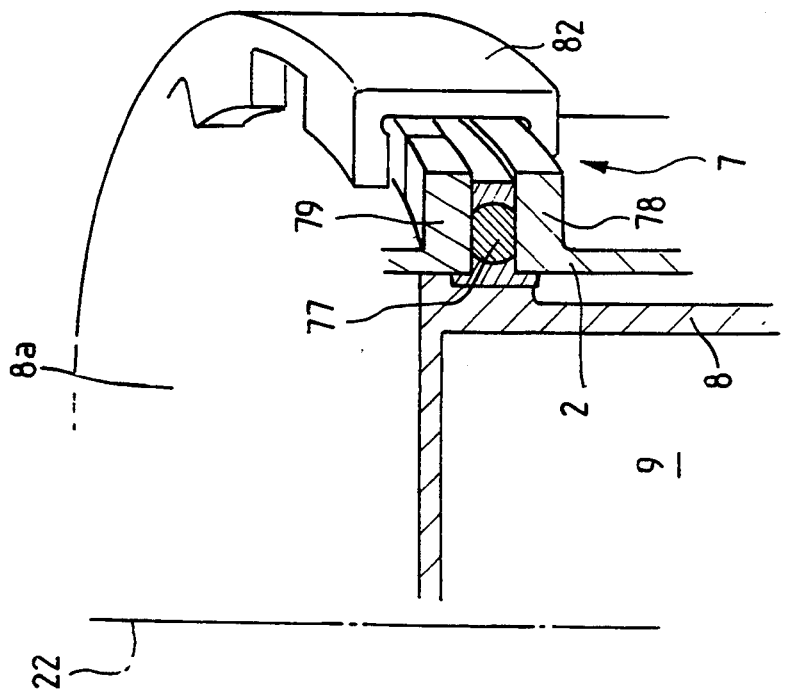
FIGS. 24 and 25 are detail views, partially in perspective, showing two particular embodiments of coupling flanges for a cartridge loading compartment of the invention.
Figure 24:
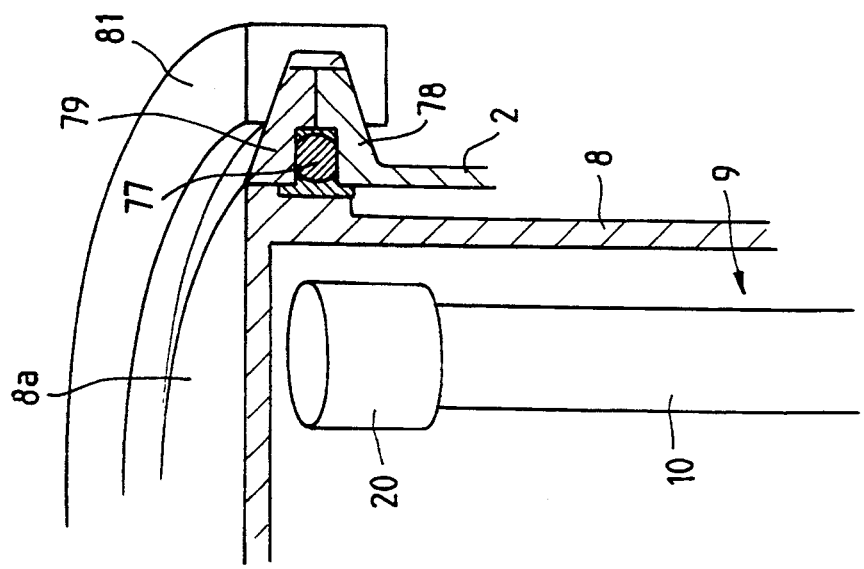

FIGS. 24 and 25 show two details of how rapid disconnection flanges can be implemented for a hermetic compartment 8 that is designed to be mounted in an enclosure 2 (FIG. 2) with the possibility of exchanging an entire carousel.

FIG. 24 shows flanges 79 and 78 of the compartment 8 and of the enclosure 2 having a sealing ring 77 clamped between them and being united by a strap 81.

FIG. 25 shows flanges 79 and 78 of the autoclave or interrupted thread type held by a bayonet type member 82.

Figure 32:
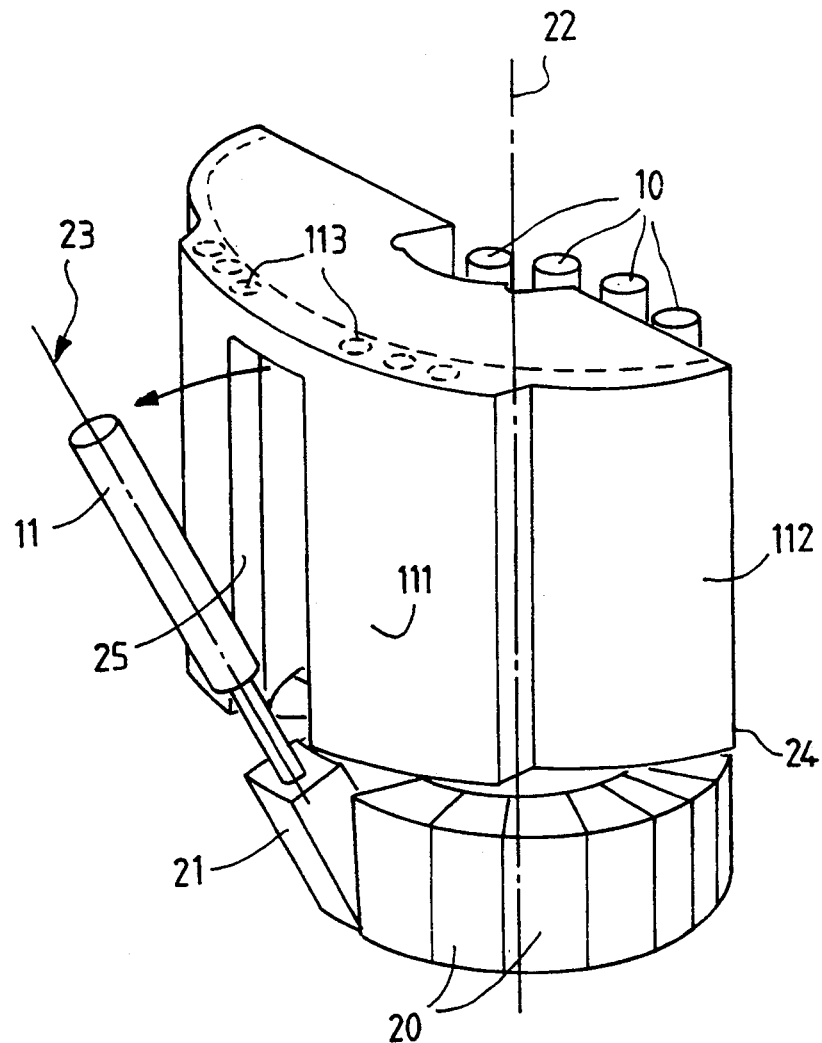
FIG. 32 is a perspective view of an enclosure of a cartridge exchange device of the invention, in which cartridge preheater means are incorporated.

FIG. 32 shows a hermetic enclosure 24 which, in a particular embodiment, contains a preheater device 111 with heater elements 113 disposed on either side of the opening 25 for loading and unloading a cartridge 11. The preheater device serves to heat up the cartridge to be treated progressively prior to its insertion in the furnace, and after treatment it serves to cool it down progressively. The enclosure 24 thus includes a gradient zone 112 in portions remote from the opening 25 and an isothermal zone 111 on either side of the opening 25.

In mechanisms of the present invention, the contact surfaces involved in rotation and/or translation motion include dry lubrication elements suitable for weightlessness and the ambient temperatures during operation. By way of example, these elements may comprise surface coatings of titanium nitride or of titanium carbide. Ball bearings may be lubricated by means of lead or of molybdenum bisulfide, for example.

I claim:

1. A loader device for an automatic space treatment furnace having a longitudinal axis and means for driving the furnace in guided translation along said longitudinal axis, the loader device being disposed in the vicinity of the furnace and comprising both a cartridge-carrying carousel fitted with a set of cartridge holders removably receiving sealed closed cartridges each designed to contain a sample for treatment in said space furnace, the cartridges being disposed in the carousel parallel to its axis of rotation, and a control mechanism for imparting indexed rotary drive to the cartridge holders, wherein the carousel is itself mounted relative to the furnace in such a manner that its axis of rotation forms a predetermined angle α relative to the longitudinal axis of the furnace, and wherein each cartridge holder of the carousel co-operates with a tilting mechanism to enable each cartridge to take up a working position in which the axis of the cartridge is tilted through said predetermined angle α relative to the axis of rotation of the carousel so as to be aligned with the axis of the furnace.

2. A device according to claim 1, wherein the control mechanism for imparting indexed rotary drive to the cartridge holders and the mechanism for tilting the cartridge holders are constituted by a single mechanism.

3. A device according to claim 1, wherein said predetermined angle α between the axis of rotation of the carousel and the longitudinal axis of the furnace lies in the range about 30° to about 50°.

4. A device according to claim 1, wherein the carousel and the control mechanism for rotating and for tilting the cartridge holders are placed inside a hermetic container provided with a closable side opening.

5. A device according to claim 1, wherein the axis of rotation of the carousel is inclined at said predetermined angle α relative to the wall of a space vehicle which is itself parallel to the axis of the furnace which is removably mounted in a housing in said wall.

6. A device according to claim 1, wherein the axis of rotation of the carousel is parallel to the wall of a space vehicle, while the axis of the furnace that is removably mounted in a housing in said wall is itself inclined relative to said wall.

7. A device according to claim 1, wherein the carousel is disposed in a loading compartment provided with a cover disposed at its end opposite from the cartridge holders so as to enable all of the cartridges to be loaded and unloaded through the end opposite from the cartridge holders between two treatment sequences for a set of cartridges.

8. A device according to claim 1, wherein the carousel is disposed in a loading compartment provided with a cover disposed at the same end as the cartridge holders so as to enable all of the cartridges to be loaded and unloaded through the cartridge holders between two treatment sequences of a set of cartridges.

9. A device according to claim 1, wherein the carousel is disposed in a loading compartment connected by flanges to an enclosure defining a process chamber and containing the furnace together with the control mechanisms for rotating and tilting the cartridge holders so as to enable the carousel assembly to be exchanged between two treatment sequences of a set of cartridges.

10. A device according to claim 1, wherein each cartridge holder comprises an essentially plane interface for mechanical positioning and for electrical connection and adapted to co-operate with a single, essentially plane complementary interface for mechanical positioning and for electrical connection disposed on means for supporting said means for driving the furnace in translation.

11. A device according to claim 10, wherein said mechanical positioning and electrical connection interfaces include complementary V-shaped centering elements.

12. A device according to claim 10, wherein said mechanical positioning and electrical connection interfaces include first electrical contacts for passing high current required for the process during the treatment of samples, and second electrical contacts for passing low current for electrical measurement signals.

13. A device according to claim 1, including a cartridge preheater device which extends in stationary manner around at least a portion of the carousel on either side of an opening enabling a cartridge to be tilted into the working position.

14. A device according to claim 1, including a shock absorber device for damping vibration and comprising both a central wheel disposed in the center of the carousel in the vicinity of the ends of the cartridges opposite from the cartridge holders and provided with depressions formed in its periphery for receiving the ends of the cartridges, and a static outer band which surrounds the central wheel outside the cartridges and which has a gap to enable a cartridge to be tilted into the working position.

15. A device according to claim 1, wherein the control mechanism for imparting indexed rotary drive to the cartridge holders comprises an electric motor which co-operates with a stepdown gear mechanism and a Maltese cross device acting on the bottom portions of the cartridge holders.

16. A device according to claim 1, wherein the control device for imparting indexed rotary drive to the cartridge holders comprises an electric motor that drives a rotation control finger acting on grooves formed in the cartridge holders, and a cam co-operating with recesses formed in the cartridge holders to provide locking in each indexed position.

17. A device according to claim 16, wherein the electric motor has an axis that is parallel to the axis of rotation of the carousel.

18. A device according claim 16, wherein the electric motor has an axis that is perpendicular to and that intersects the axis of rotation of the carousel.

19. A device according to claim 1, wherein the cartridge holder tilting mechanism comprises a short drive system driven by the control mechanism for rotating the cartridge holders.

20. A device according to claim 19, wherein the cartridge holder tilting mechanism comprises a cam-forming member which is driven from an electric motor constituting the initiator member of the control mechanism for rotating the cartridge holders, and which co-operates with shaped upper portions of the cartridge holders, each cartridge holder also co-operating with a return spring in a rest position parallel to the axis of rotation of the carousel.

21. A device according to claim 19, wherein the cartridge holder tilting mechanism comprises a slider member which co-operates with shaped upper portions of the cartridge holders and which is driven with reciprocating motion by an electric motor constituting the initiator member of the control mechanism for rotating the cartridge holders.

22. A device according to claim 19, wherein the cartridge holder tilting mechanism includes a toggle mechanism acting on the upper portions of the cartridge holders and co-operating with an electric motor.

* * * * *

UNITED STATES PATENT AND TRADEMARK OFFICE
CERTIFICATE OF CORRECTION

PATENT NO. : 5,372,500
DATED : Dec. 13, 1994
INVENTOR(S) : Dominique Valentian

It is certified that error appears in the above-indentified patent and that said Letters Patent is hereby corrected as shown below:

In the ABSTRACT, line 14, "angle a" should read --angle $\alpha$--.

Column 5, line 6, "to The axis" should read --to the axis--.

Column 6, line 30, "carouse;" should read --carousel;---.

Column 7, line 34, "angle $\alpha 0$" should read --angle $\alpha$--.

Column 10, line 20, "witch" should read --with--.

Signed and Sealed this

Twelfth Day of September, 1995

Attest:

BRUCE LEHMAN

Attesting Officer

Commissioner of Patents and Trademarks